(12) United States Patent
Brownlee

(10) Patent No.: US 8,441,216 B2
(45) Date of Patent: May 14, 2013

(54) POWER SUPPLY SYSTEM FOR A BUILDING

(75) Inventor: Michael S. Brownlee, Alameda, CA (US)

(73) Assignee: ALVA Systems, Inc., Alameda, CA (US)

( * ) Notice: Subject to any disclaimer, the term of this patent is extended or adjusted under 35 U.S.C. 154(b) by 663 days.

(21) Appl. No.: 12/553,893

(22) Filed: Sep. 3, 2009

(65) Prior Publication Data
US 2010/0052577 A1   Mar. 4, 2010

Related U.S. Application Data

(60) Provisional application No. 61/239,013, filed on Sep. 1, 2009, provisional application No. 61/238,139, filed on Aug. 29, 2009, provisional application No. 61/093,721, filed on Sep. 3, 2008.

(51) Int. Cl.
  *H05B 37/02* (2006.01)
(52) U.S. Cl.
  USPC .......................................... 315/362; 315/32
(58) Field of Classification Search ............... 315/362, 315/32
  See application file for complete search history.

(56) References Cited

U.S. PATENT DOCUMENTS

| | | | |
|---|---|---|---|
| 3,739,226 A * | 6/1973 | Seiter et al. ................ | 315/86 |
| 3,864,561 A | 2/1975 | Spira et al. | |
| 4,466,052 A | 8/1984 | Thrap | |
| 4,482,818 A | 11/1984 | Ryczek et al. | |
| 4,484,257 A | 11/1984 | Sugimoto | |
| 4,628,460 A | 12/1986 | Frederich | |
| 4,672,229 A | 6/1987 | Skarman et al. | |
| 4,805,083 A | 2/1989 | Konopka | |
| 5,019,767 A | 5/1991 | Shirai et al. | |
| 5,055,994 A | 10/1991 | Schoofs | |
| 5,121,089 A | 6/1992 | Larson | |
| 5,196,995 A | 3/1993 | Gulczynski | |
| 5,272,614 A | 12/1993 | Brunk et al. | |
| 5,313,382 A | 5/1994 | Farrington | |
| 5,321,348 A | 6/1994 | Vinciarelli et al. | |
| 5,347,211 A | 9/1994 | Jakubowski | |
| 5,493,618 A | 2/1996 | Stevens et al. | |
| 5,563,782 A | 10/1996 | Chen et al. | |
| 5,570,279 A | 10/1996 | Venkataramanan | |
| 5,580,155 A | 12/1996 | Hildebrand et al. | |

(Continued)

FOREIGN PATENT DOCUMENTS

| | | |
|---|---|---|
| CN | 2270161 | 12/1997 |
| JP | 2002231396 | 8/2002 |
| WO | WO 2011/029049 | 3/2011 |

OTHER PUBLICATIONS

PCT/US2010/047889 International Search Report dated Oct. 17, 2011.

(Continued)

*Primary Examiner* — James H Cho
(74) *Attorney, Agent, or Firm* — K&L Gates LLP

(57) ABSTRACT

An electrical system, which includes a light switch housing and an AC-to-DC converter carried by the light switch housing. The electrical system includes an input power line which provides an AC signal to an input of the converter and an output power line coupled to an output of the converter. An electrical device operates in response to receiving an output signal from the output power line, wherein the output signal is a DC signal.

25 Claims, 35 Drawing Sheets

U.S. PATENT DOCUMENTS

| | | |
|---|---|---|
| 5,615,101 A | 3/1997 | Moriarty |
| 5,654,880 A | 8/1997 | Brkovic et al. |
| 5,742,495 A | 4/1998 | Barone |
| 5,777,844 A | 7/1998 | Kiefer |
| 5,811,963 A | 9/1998 | Elwell |
| 5,859,768 A | 1/1999 | Hall et al. |
| 5,914,865 A | 6/1999 | Barbehenn et al. |
| 5,943,223 A | 8/1999 | Pond |
| 5,959,849 A | 9/1999 | Batarseh |
| 6,016,038 A | 1/2000 | Mueller et al. |
| 6,051,787 A | 4/2000 | Rintz |
| 6,061,259 A | 5/2000 | DeMichele |
| 6,061,261 A | 5/2000 | Chen et al. |
| 6,064,177 A | 5/2000 | Dixon |
| 6,154,379 A | 11/2000 | Okita |
| 6,160,728 A | 12/2000 | Peterson et al. |
| 6,246,597 B1 | 6/2001 | Peron |
| 6,266,261 B1 | 7/2001 | Lanni |
| 6,320,748 B1 | 11/2001 | Roden et al. |
| 6,355,885 B1 | 3/2002 | Rintz et al. |
| 6,362,987 B1 * | 3/2002 | Yurek et al. .......... 363/146 |
| 6,388,393 B1 * | 5/2002 | Illingworth .......... 315/291 |
| 6,459,175 B1 | 10/2002 | Potega |
| 6,473,322 B2 | 10/2002 | Marien et al. |
| 6,518,724 B2 | 2/2003 | Janik |
| 6,608,253 B1 | 8/2003 | Rintz |
| 6,609,804 B2 | 8/2003 | Nolan et al. |
| 6,641,294 B2 | 11/2003 | Lefebvre |
| 6,643,158 B2 | 11/2003 | McDonald et al. |
| 6,650,560 B2 | 11/2003 | MacDonald et al. |
| 6,700,808 B2 | 3/2004 | MacDonald et al. |
| 6,775,163 B2 | 8/2004 | McDonald et al. |
| 6,784,623 B2 | 8/2004 | Smith |
| 6,791,853 B2 | 9/2004 | Afzal et al. |
| 6,826,059 B2 | 11/2004 | Bockle et al. |
| 6,833,597 B2 | 12/2004 | Blasko |
| 6,853,150 B2 | 2/2005 | Clauberg et al. |
| 6,864,798 B2 | 3/2005 | Janik |
| 6,867,558 B2 | 3/2005 | Gaus, Jr. et al. |
| 6,867,575 B2 | 3/2005 | D'Cunha |
| 6,885,035 B2 | 4/2005 | Bhat et al. |
| 6,903,950 B2 | 6/2005 | Afzal et al. |
| 6,977,815 B2 | 12/2005 | Hsu |
| 6,989,701 B2 | 1/2006 | Lin et al. |
| 6,993,289 B2 * | 1/2006 | Janik .......... 455/41.2 |
| 7,019,337 B2 | 3/2006 | Eden et al. |
| 7,042,379 B2 | 5/2006 | Choe |
| 7,106,566 B2 | 9/2006 | Liu et al. |
| 7,161,311 B2 | 1/2007 | Mueller et al. |
| 7,209,813 B2 * | 4/2007 | Namaky .......... 701/33.2 |
| 7,236,375 B2 | 6/2007 | Fukumoto et al. |
| 7,274,160 B2 | 9/2007 | Mueller et al. |
| 7,279,853 B2 | 10/2007 | Chong |
| 7,300,302 B2 | 11/2007 | Kajiwara et al. |
| 7,321,203 B2 | 1/2008 | Marosek |
| 7,336,512 B2 | 2/2008 | Geissler |
| 7,375,994 B2 | 5/2008 | Andreycak |
| 7,405,493 B2 | 7/2008 | Leo |
| 7,550,931 B2 | 6/2009 | Lys et al. |
| 7,572,028 B2 | 8/2009 | Mueller et al. |
| 7,573,929 B2 | 8/2009 | Otoma |
| 7,583,901 B2 | 9/2009 | Nakagawa et al. |
| 7,773,016 B2 | 8/2010 | Miao |
| 2006/0043796 A1 | 3/2006 | Biskup, Sr. |
| 2006/0083031 A1 | 4/2006 | Cook |
| 2006/0197465 A1 | 9/2006 | Chen |
| 2006/0245174 A1 | 11/2006 | Ashdown et al. |
| 2007/0103942 A1 | 5/2007 | Hung et al. |
| 2007/0153026 A1 | 7/2007 | Ashdown |
| 2008/0043506 A1 | 2/2008 | Ozaki et al. |
| 2008/0049458 A1 | 2/2008 | Pozzuoli et al. |
| 2008/0054728 A1 | 3/2008 | Watson |
| 2008/0258695 A1 | 10/2008 | Kumar et al. |
| 2008/0284343 A1 | 11/2008 | Kuo et al. |
| 2009/0195063 A1 | 8/2009 | Joseph et al. |
| 2009/0251072 A1 | 10/2009 | Barnett et al. |
| 2009/0267085 A1 | 10/2009 | Lee et al. |
| 2009/0295300 A1 | 12/2009 | King et al. |
| 2009/0309511 A1 * | 12/2009 | Mangiaracina .......... 315/291 |
| 2010/0007286 A1 | 1/2010 | Koh et al. |
| 2010/0027249 A1 * | 2/2010 | Connor et al. .......... 362/183 |
| 2010/0052568 A1 | 3/2010 | Cohen et al. |
| 2010/0052577 A1 | 3/2010 | Brownlee |
| 2010/0060175 A1 | 3/2010 | Lethellier |
| 2010/0066867 A1 | 3/2010 | Yoshikawa |
| 2010/0079075 A1 | 4/2010 | Son |

OTHER PUBLICATIONS

PCT/US2010/047889 ALVSYS-001WO International Preliminary Report on Patentability dated Mar. 6, 2012.

EP10760162.7 ALVSYS-001EP 161/162 EPC Communication dated May 3, 2012.

PCT/US2012/025030 ALVSYS-003W0 International Search Report May 21, 2012 and Written Opinion May 8, 2012.

* cited by examiner

US 8,441,216 B2

POWER SUPPLY SYSTEM FOR A BUILDING

CROSS-REFERENCE TO RELATED APPLICATIONS

This application claims priority to U.S. Provisional Application No. 61/093,721, which was filed on Sep. 3, 2008, the contents of which are incorporated by reference as though fully set forth herein.

This application claims priority to U.S. Provisional Application No. 61/238,139, which was filed on Aug. 29, 2009, the contents of which are incorporated by reference as though fully set forth herein.

This application claims priority to U.S. Provisional Application No. 61/239,013, which was filed on Sep. 1, 2009, the contents of which are incorporated by reference as though fully set forth herein.

BACKGROUND OF THE INVENTION

1. Field of the Invention

The invention relates to supplying power to electrical devices in a building.

2. Description of the Related Art

There are many different ways in which power is provided to an electrical device in a building, such as through an electrical outlet. The flow of power is typically controlled by a switch, such as a wall mounted light switch. More information regarding providing power to electrical devices can be found in "Complete Wiring", I.A., Meredith Publishing Group, 2008 (ISBN: 978-0-696-23710-2).

In one example, an electrical device is operatively coupled to an electrical outlet, and the electrical device is operated in response to receiving power from the electrical outlet. In another example, the electrical device includes a lighting system operatively coupled to a light switch. The lighting system is operated in response to activating and deactivating the light switch. The lighting system receives power and emits light in response to the light switch being activated. Further, the lighting system does not receive power and does not emit light in response to the light switch being deactivated. In both of these examples, the building includes electrical wiring which allows the flow of power to the electrical device.

Some of these electrical devices are driven by an AC power signal and others are driven by a DC power signal. For example, fluorescent lights are driven by an AC power signal and ceiling fans are driven by a DC power signal. However, the power supplied to these electrical devices is typically AC power and not DC power. Electrical devices that are driven by a DC power signal generally include an AC-to-DC converter which receives the AC power signal and converts it to a DC power signal. Hence, an electrical device which is driven by a DC power signal includes an AC-to-DC converter.

To cut costs, manufacturers will often use AC-to-DC converters that are prone to failure. An AC-to-DC converter that fails can present a serious electrical shock and/or fire hazard.

BRIEF SUMMARY OF THE INVENTION

The present invention is directed to providing DC power to an electrical device in a building. The novel features of the invention are set forth with particularity in the appended claims. The invention will be best understood from the following description when read in conjunction with the accompanying drawings.

These and other features, aspects, and advantages of the present invention will become better understood with reference to the following drawings and description.

BRIEF DESCRIPTION OF THE DRAWINGS

FIG. 7a is a perspective view of one embodiment of the electrical system of FIG. 5a carried by the light switch housing of FIG. 6a.

FIG. 8a is a perspective view of one embodiment of the electrical system of FIG. 5a carried by the light switch housing of FIG. 6a.

FIG. 9a is a perspective view of one embodiment of the electrical system of FIG. 5a carried by the light switch housing of FIG. 6a.

FIGS. 10b and 10c are perspective views of the power adapter of FIG. 10a and the light switch housing of FIG. 6a.

FIG. 13b is a perspective view of a light socket of the electrical device of FIG. 13a.

DETAILED DESCRIPTION OF THE INVENTION

Figure 1:
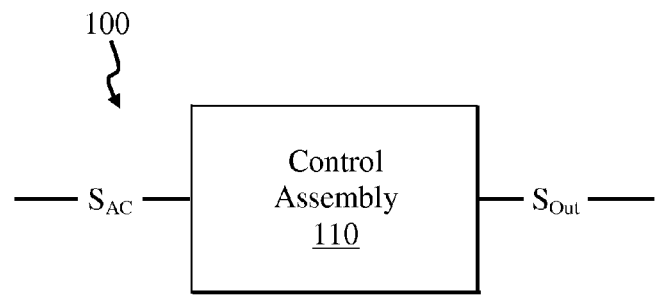
FIG. 1 is a block diagram of an electrical system, which includes a control assembly.

FIG. 1 is a block diagram of an electrical system 100. In this embodiment, electrical system 100 include a control assembly 110 which provides an output signal $S_{Out}$, when control assembly 110 is activated, in response to receiving an AC signal $S_{AC}$. Further, control assembly 110 does not provide output signal $S_{Out}$, when control assembly 110 is deactivated, in response to receiving AC signal $S_{AC}$. It should be noted that control assembly 110 has an activated condition when it is activated, and control assembly 110 has a deactivated condition when it is deactivated. It should also be noted that output signal $S_{Out}$ is sometimes referred to as output signal $S_{Output}$ herein.

It should also be noted that an AC signal generally oscillates as a function of time. In one example, the AC signal oscillates as a function of time in a periodic manner. An example of an AC signal that oscillates as a function of time in a periodic manner is a sinusoidal signal. A DC signal does not oscillate as a function of time in a periodic manner. Hence, an AC signal is not a DC signal. More information regarding AC power, DC power, AC signals and DC signals can be found in U.S. Pat. Nos. 5,019,767, 5,563,782, 6,061,261, 6,266,261, 6,459,175, 7,106,566 and 7,300,302, the contents of all of which are incorporated by reference as though fully set forth herein.

In some embodiments, control assembly 110 provides an output power signal, when control assembly 110 is activated, in response to receiving an AC power signal. Further, control assembly 110 does not provide the output power signal, when control assembly 110 is deactivated, in response to receiving the AC power signal.

Figure 2A:
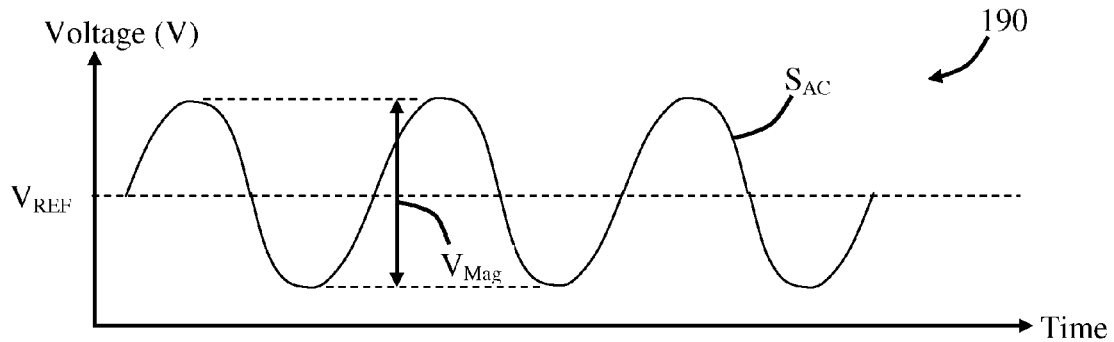
FIG. 2a is a graph of voltage versus time for one example of an AC signal $S_{AC}$ provide to the electrical system of FIG. 1.

FIG. 2a is a graph 190 of voltage versus time for one example of AC signal $S_{AC}$. In this example, AC signal $S_{AC}$ is sinusoidal and oscillates about a reference voltage level $V_{REF}$ and has a signal magnitude $V_{MAG}$. AC signal $S_{AC}$ can oscillate at many different frequencies, such as 60 hertz (Hz). Signal magnitude $V_{MAG}$ can have many different values, such as 120 volts (V).

Figure 2B:
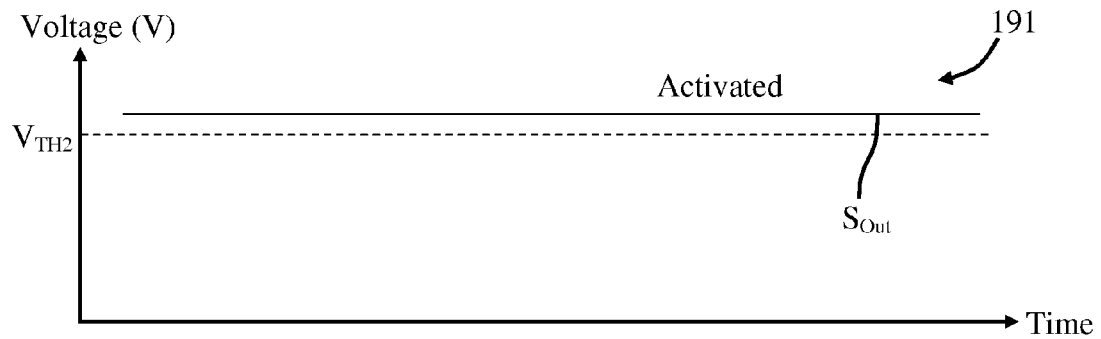
FIG. 2b is a graph of voltage versus time for one example of an output signal $S_{Out}$ provided by the electrical system of FIG. 1 when the control assembly is activated.
Figure 2C:
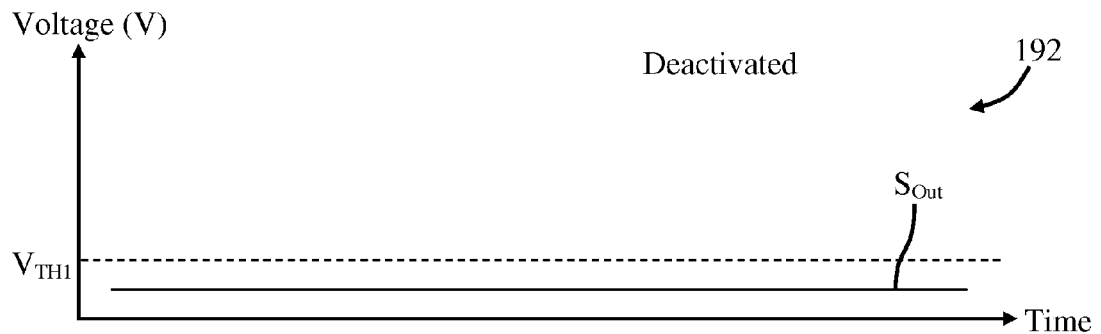
FIG. 2c is a graph of voltage versus time for one example of an output signal $S_{Out}$ provided by the electrical system of FIG. 1 when the control assembly is deactivated.

FIG. 2b is a graph 191 of voltage versus time for one example of output signal $S_{Out}$ when control assembly 110 is activated. FIG. 2c is a graph 192 of voltage versus time for one example of output signal $S_{Out}$ when control assembly 110 is deactivated. In this example, output signal $S_{Out}$ has a value less than a threshold voltage level $V_{TH1}$ when control assembly 110 is deactivated. Further, output signal $S_{Out}$ has a value greater than a threshold voltage level $V_{TH2}$ when control assembly 110 is activated. It should be noted that threshold voltage level $V_{TH1}$ is less than threshold voltage level $V_{TH2}$.

Figure 2D:
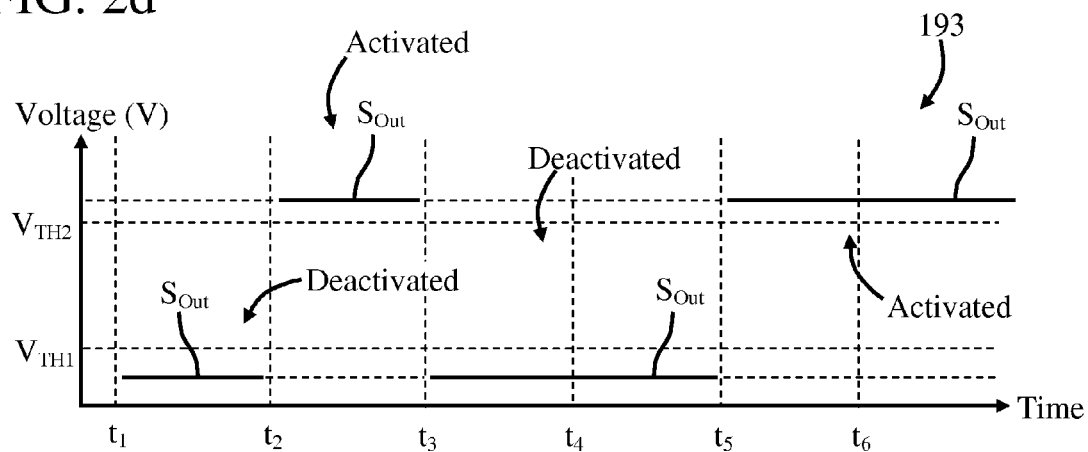
FIG. 2d is a graph of voltage versus time for one example of an output signal $S_{Out}$ provided by the electrical system of FIG. 1 when the control assembly is moved between activated and deactivated conditions.

FIG. 2d is a graph 193 of voltage versus time for one example of output signal $S_{Out}$ when control assembly 110 is activated. In this example, control assembly 110 switched between activated and deactivated conditions as a function of time. Control assembly 110 is switched between activated and deactivated conditions as a function of time so that output signal $S_{Out}$ is provided with values above threshold voltage level $V_{TH2}$ and below threshold voltage level $V_{TH1}$ in response. As discussed in more detail below, output signal $S_{Out}$ is provided with a value above threshold voltage level $V_{TH2}$ in response to control assembly 110 being activated, and output signal $S_{Out}$ is provided with a value below threshold voltage level $V_{TH1}$ in response to control assembly 110 being deactivated.

For example, control assembly 110 has a deactivated condition between times $t_1$ and $t_2$ and an active condition between times $t_2$ and $t_3$. Control assembly 110 has a deactivated condition between times $t_3$ and $t_4$ and between times $t_4$ and $t_5$. Control assembly 110 has an active condition between times $t_5$ and $t_6$ and for times greater than time $t_6$. It should be noted that time $t_2$ is greater than time $t_1$, time $t_3$ is greater than time $t_2$, time $t_4$ is greater than time $t_3$, time $t_5$ is greater than time $t_4$ and time $t_6$ is greater than time $t_5$.

In this example, output signal $S_{Out}$ has a value less than threshold voltage level $V_{TH1}$ when control assembly 110 is deactivated between times $t_1$ and $t_2$. Output signal $S_{Out}$ has a value greater than threshold voltage level $V_{TH2}$ when control assembly 110 is activated between times $t_2$ and $t_3$. Output signal $S_{Out}$ has a value less than threshold voltage level $V_{TH1}$ when control assembly 110 is deactivated between times $t_3$ and $t_4$ and between times $t_4$ and $t_5$. Output signal $S_{Out}$ has a value greater than threshold voltage level $V_{TH2}$ when control assembly 110 is activated for times greater than time $t_6$. It is useful to provide output signal $S_{Out}$ with values above threshold voltage level $V_{TH2}$ and below threshold voltage level $V_{TH1}$ for many different reasons.

Figure 2E:
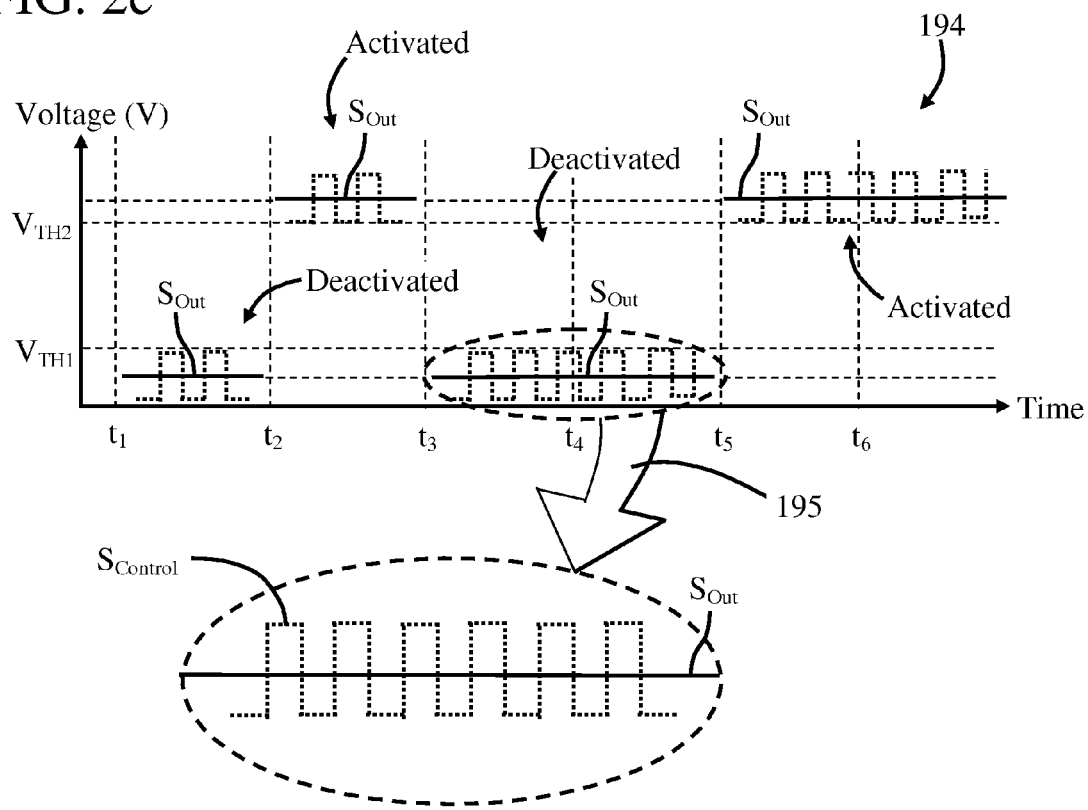
FIG. 2e is a graph of voltage versus time for one example of output signal $S_{Out}$ of FIG. 2d modulated with a control signal $S_{Control}$.

FIG. 2e is a graph 194 of voltage versus time for one example of output signal $S_{Out}$ when control assembly 110 is activated. In this example, control assembly 110 switched between activated and deactivated conditions as a function of time. Control assembly 110 is switched between activated and deactivated conditions as a function of time so that output signal $S_{Out}$ is provided with values above threshold voltage level $V_{TH2}$ and below threshold voltage level $V_{TH1}$ in response. As discussed in more detail below, output signal $S_{Out}$ is provided with a value above threshold voltage level $V_{TH2}$ in response to control assembly 110 being activated, and output signal $S_{Out}$ is provided with a value below threshold voltage level $V_{TH1}$ in response to control assembly 110 being deactivated.

For example, control assembly 110 has a deactivated condition between times $t_1$ and $t_2$ and an active condition between times $t_2$ and $t_3$. Control assembly 110 has a deactivated condition between times $t_3$ and $t_4$ and between times $t_4$ and $t_5$. Control assembly 110 has an active condition between times $t_5$ and $t_6$ and for times greater than time $t_6$. It should be noted that time $t_2$ is greater than time $t_1$, time $t_3$ is greater than time $t_2$, time $t_4$ is greater than time $t_3$, time $t_5$ is greater than time $t_4$ and time $t_6$ is greater than time $t_5$.

In this example, output signal $S_{Out}$ has a value less than threshold voltage level $V_{TH1}$ when control assembly 110 is deactivated between times $t_1$ and $t_2$. Output signal $S_{Out}$ has a value greater than threshold voltage level $V_{TH2}$ when control assembly 110 is activated between times $t_2$ and $t_3$. Output signal $S_{Out}$ has a value less than threshold voltage level $V_{TH1}$ when control assembly 110 is deactivated between times $t_3$ and $t_4$ and between times $t_4$ and $t_5$. Output signal $S_{Out}$ has a value greater than threshold voltage level $V_{TH2}$ when control assembly 110 is activated for times greater than time $t_6$. It is useful to provide output signal $S_{Out}$ with values above threshold voltage level $V_{TH2}$ and below threshold voltage level $V_{TH1}$ for many different reasons.

In this embodiment, control assembly 110 provides a control signal $S_{Control}$, which is modulated with output signal $S_{Out}$, as indicated by an indication arrow 195. Control signal $S_{Control}$ is shown as being a binary signal which alternates between high and low states for simplicity and ease of discussion. However, it should be noted that control signal $S_{Control}$ typically includes high and low states chosen to correspond to information, such as binary data, and the binary data is chosen to control the operation of an electrical device. In some embodiments, the electrical device includes an electric motor which is operated in response to output signal $S_{Out}$ and/or control signal $S_{Control}$. In one example, the electrical device is a ceiling fan which includes a ceiling fan motor. More information regarding ceiling fans is provided in the above-identified related provisional applications. In another example, the electrical device is a vent fan which includes a n electrical vent motor.

In this embodiment, output signal $S_{Out}$ and control signal $S_{Control}$ are both wired signals because they flow along a wire, such as a conductive line. In this way, the electrical device is operated in response to receiving a wired signal that is modulated with output signal $S_{Out}$. In these embodiments, the electrical device includes a controller that is responsive to wired control signal $S_{Control}$.

However, in some embodiments, control signal $S_{Control}$ is a wireless signal which is flowed wirelessly to the electrical device. In this way, the electrical device is operated in response to receiving a wireless signal that is not modulated with output signal $S_{Out}$. Information regarding an electrical device will be discussed in more detail presently. In these embodiments, the electrical device includes a controller that is responsive to wireless control signal $S_{Control}$ through an antenna.

Figure 3:
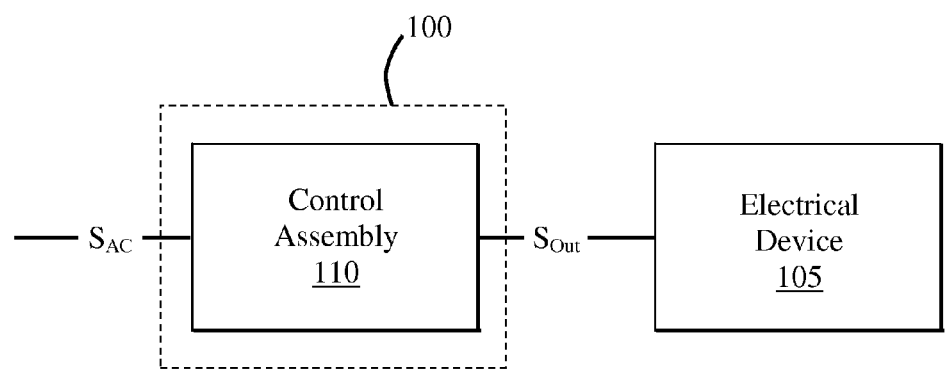
FIG. 3 is a block diagram of the electrical system of FIG. 1 connected to an electrical device.

FIG. 3 is a block diagram of electrical system 100, which includes an electrical device 105 in communication with control assembly 110. Electrical device 105 is in communication with control assembly 110 so that output signal $S_{Out}$ flows between control assembly 110 and electrical device 105. In one embodiment, electrical device 105 receives output signal $S_{Out}$ from control assembly 110.

Electrical device 105 is operatively coupled to control assembly 110. Electrical device 105 can be operatively coupled to control assembly 110 in many different ways. In this example, electrical device 105 operates in response to control assembly 110 being activated. Electrical device 105 operates in response to control assembly 110 being activated because output signal $S_{Out}$ has a value greater than threshold voltage level $V_{TH2}$. In this example, electrical device 105 is inoperative in response to control assembly 110 being deactivated. Electrical device 105 is inoperative in response to control assembly 110 being deactivated because output signal $S_{Out}$ has a value less than threshold voltage level $V_{TH1}$. In this way, electrical device 105 is operatively coupled to control assembly 110.

Electrical device 105 can be of many different types. In one embodiment, electrical device 105 is embodied as a solid-state light emitting device which emits light when it is operative and does not emit light when it is inoperative. One example of a solid state light emitting device is a light emitting diode. Light emitting diodes are provided by many different manufacturers, such as Nichia Corporation of Tokyo, Japan and Cree, Inc. of Durham, N.C. It should be noted that some solid state light emitting device emit white light, which is useful for illuminating a room, for example. More information regarding solid state light emitting devices is provided below with the discussion of FIG. 9.

Referring to FIG. 3 and graph 193 of FIG. 2d, electrical device 105 is inoperative between times $t_1$ and $t_2$ in response to control assembly 110 being deactivated. Electrical device 105 is operative between times $t_2$ and $t_3$ in response to control assembly 110 being activated. Further, electrical device 105 is inoperative between times $t_3$ and $t_4$ and between times $t_4$ and $t_5$ in response to control assembly 110 being deactivated. Electrical device 105 is operative for times greater than time $t_6$ in response to control assembly 110 being activated. In this way, electrical device 105 is repeatably moveable between operative and inoperative conditions in response to moving control assembly 110 between activated and deactivated conditions. It should be noted that control assembly 110 can be of many different types and can include many different components, several of which will be discussed in more detail presently.

Figure 4:
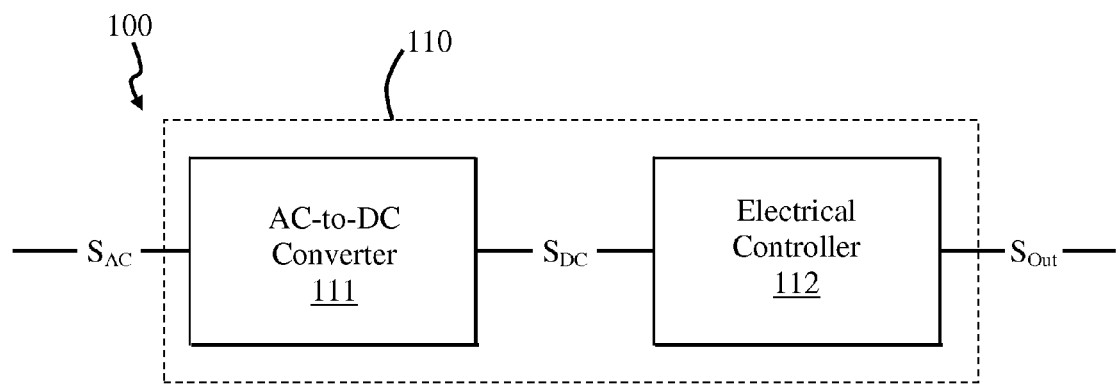
FIG. 4 is a block diagram of one embodiment of a control assembly, which can be included with the electrical system of FIG. 1.

FIG. 4 is a block diagram of one embodiment of control assembly 110. In this embodiment, control assembly 110 includes an AC-to-DC converter 111 in communication with an electrical controller 112. AC-to-DC converter 111 receives AC signal $S_{AC}$ and provides a DC signal $S_{DC}$ to control assembly 110 in response. Control assembly 110 receives DC signal $S_{DC}$ from AC-to-DC converter 111 and provides output signal $S_{Out}$ in response. Control assembly 110 provides DC signal $S_{DC}$, when electrical controller 112 is activated, in response to receiving AC signal $S_{AC}$. Further, control assembly 110 does not provide DC signal $S_{DC}$, when electrical controller 112 is deactivated, in response to receiving AC signal $S_{AC}$. In this way, electrical system 100 includes a control assembly 110 which includes an electrical controller operatively coupled to an AC-to-DC converter. It should be noted that control assembly 110 is activated and deactivated in response to electrical controller 112 being activated and deactivated, respectively.

AC-to-DC converter 111 can be of many different types of converters. Examples of converters are disclosed in U.S. Pat. Nos. 5,347,211, 6,643,158, 6,650,560, 6,700,808, 6,775,163, 6,791,853 and 6,903,950, the contents of all of which are incorporated by reference as though fully set forth herein.

In this embodiment, electrical controller 112 and AC-to-DC converter 111 are positioned proximate to each other. Electrical controller 112 and AC-to-DC converter 111 can be positioned proximate to each other in many different ways. For example, electrical controller 112 and AC-to-DC converter 111 can be positioned proximate to each other by coupling them to the same support structure, such as a housing. In this way, electrical controller 112 and AC-to-DC converter 111 are carried by the same light switch housing. The housing can be of many different types, such as a light switch box. There are many different types of light switch boxes, several of which will be discussed in more detail below. In one embodiment in which the housing is a light switch box, electrical controller 112 is a light switch. Examples of light switches will be discussed in more detail below.

In some embodiments, control assembly 110 is housed by the light switch housing. Control assembly 110 is housed by the light switch housing when it extends through an internal volume of the light switch housing. In other embodiments, control assembly 110 is not housed by the light switch housing. Control assembly 110 is not housed by the light switch housing when it does not extend through an internal volume of the light switch housing.

In some embodiments, electrical controller 112 is housed by the light switch housing. Electrical controller 112 is housed by the light switch housing when it extends through an internal volume of the light switch housing. In other embodiments, electrical controller 112 is not housed by the light switch housing. Electrical controller 112 is not housed by the light switch housing when it does not extend through an internal volume of the light switch housing.

In some embodiments, AC-to-DC converter 111 is housed by the light switch housing. AC-to-DC converter 111 is housed by the light switch housing when it extends through an internal volume of the light switch housing. In other embodiments, AC-to-DC converter 111 is not housed by the light switch housing. AC-to-DC converter 111 is not housed by the light switch housing when it does not extend through an internal volume of the light switch housing.

In some embodiments, a portion of control assembly 110 is housed by the light switch housing and another portion of control assembly 110 is not housed by the light switch housing. For example, in one embodiment, electrical controller 112 is housed by the light switch housing and AC-to-DC converter 111 is not housed by the light switch housing. In another embodiment, AC-to-DC converter 111 is housed by the light switch housing and electrical controller 112 is not housed by the light switch housing.

Referring to FIG. 4 and graph 193 of FIG. 2d, control assembly 110 is deactivated between times $t_1$ and $t_2$ in response to electrical controller 112 being deactivated. Control assembly 110 is activated between times $t_2$ and $t_3$ in response to electrical controller 112 being activated. Further, control assembly 110 is deactivated between times $t_3$ and $t_4$ and between times $t_4$ and $t_5$ in response to electrical controller 112 being deactivated. Control assembly 110 is activated for times greater than time $t_6$ in response to electrical controller 112 being activated. In this way, control assembly 110 is repeatably moveable between operative and inoperative conditions in response to moving electrical controller 112 between activated and deactivated conditions.

Figure 5A:
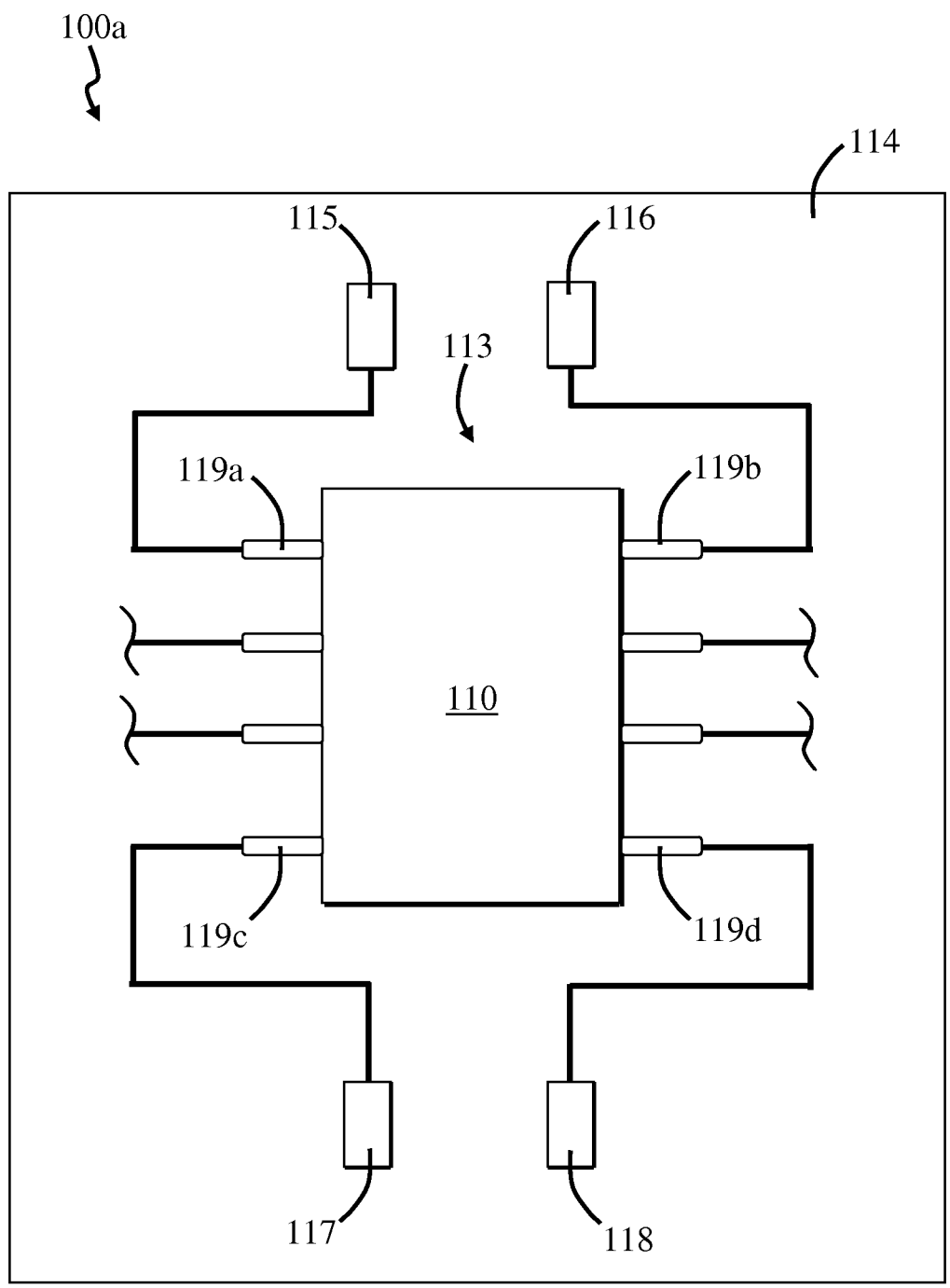
FIGS. 5a and 5b are top views of embodiments of the electrical system of FIG. 1.

FIG. 5a is a top view of one embodiment of electrical system 100, which is denoted as electrical system 100a. It should be noted that electrical system 110a corresponds to the embodiment of electrical system of FIG. 3. In this embodiment, electrical system 100a includes a circuit board 114 which carries control assembly 110, wherein control assembly 110 is included with a chip package 113. More information regarding circuit boards can be found in U.S. Pat. Nos. 5,777,844, 6,320,748 and 6,728,104, the contents of which are incorporated by reference as though fully set forth herein.

In this embodiment, electrical system 100a includes circuit board terminals 115 and 116 carried by circuit board 114. Circuit board terminals 115 and 116 are in communication with leads 119a and 119b, respectively, of chip package 113. Further, electrical system 100a includes circuit board terminals 117 and 118 carried by circuit board 114. Circuit board terminals 117 and 118 are in communication with leads 119c and 119d, respectively, of chip package 113. It should be noted that control assembly 110 is in communication with leads 119a, 119b, 119c and 119d. In this way, control assembly 110 is in communication with circuit board terminals 115, 116, 117 and 118 through leads 119a, 119b, 119c and 119d, respectively.

Figure 5B:
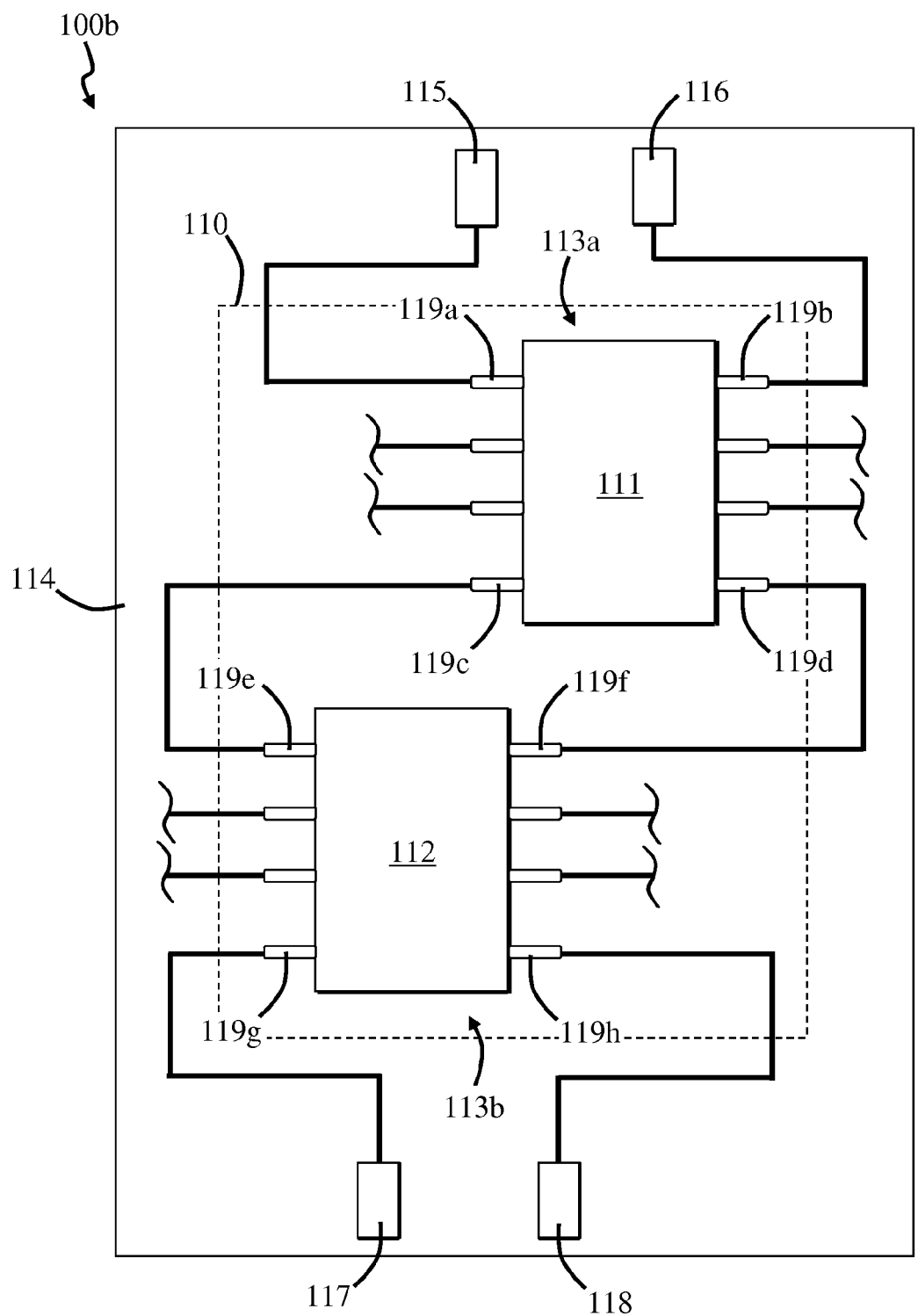

FIG. 5b is a top view of one embodiment of electrical system 100, which is denoted as electrical system 100b. It should be noted that electrical system 110b corresponds to the embodiment of electrical system of FIG. 4. In this embodiment, electrical system 100b includes circuit board 114 which carries control assembly 110, wherein control assembly 110 includes AC-to-DC converter 111 and electrical controller 112. In this embodiment, AC-to-DC converter 111 is included with a chip package 113a and electrical controller 112 is included with a chip package 113b.

In this embodiment, electrical system 100b includes circuit board terminals 115 and 116 carried by circuit board 114. Circuit board terminals 115 and 116 are in communication with leads 119a and 119b, respectively, of chip package 113a. Further, chip package 113a includes leads 119c and 119d which are connected to leads 119e and 119f of chip package 113b. Further, electrical system 100b includes circuit board terminals 117 and 118 carried by circuit board 114. Circuit board terminals 117 and 118 are in communication with leads 119g and 119h, respectively, of chip package 113b.

It should be noted that AC-to-DC converter 111 is in communication with leads 119a, 119b, 119c and 119d. In this way, AC-to-DC converter 111 is in communication with circuit board terminals 115 and 116 through leads 119a and 119b. Further, electrical controller 112 is in communication with leads 119e, 119f, 119g and 119h. In this way, electrical controller 112 is in communication with circuit board terminals 117 and 118 through leads 119g and 119h. AC-to-DC converter 111 is in communication with electrical controller 112 through leads 119c and 119d and through leads 119e and 119f.

Figure 5C:
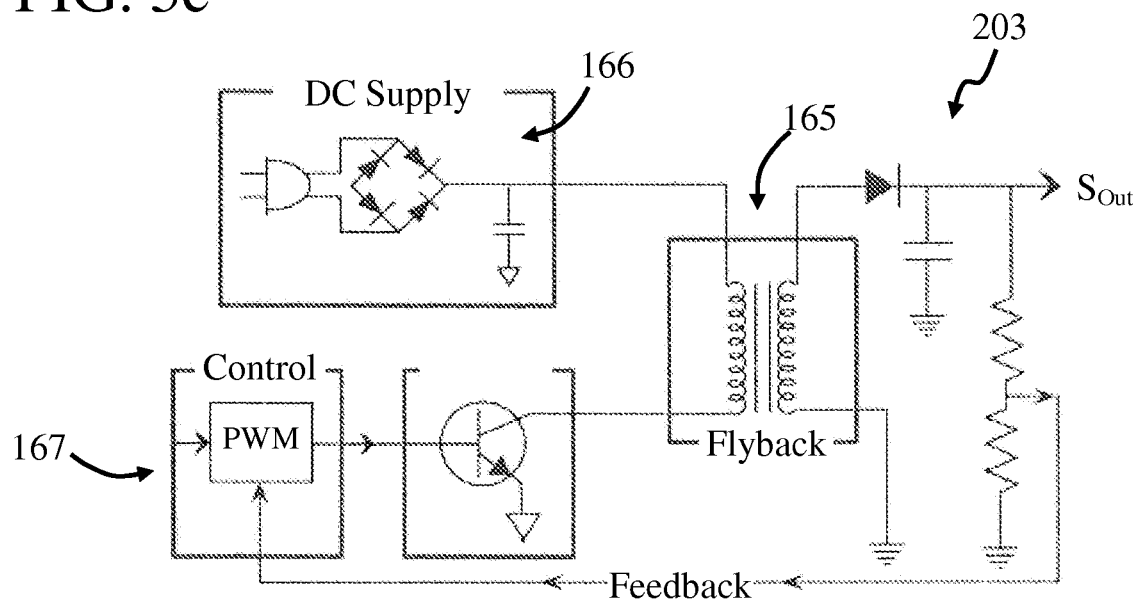
FIG. 5c is a schematic view of an electrical system embodied as a power adapter circuit.

FIG. 5c is a schematic view of an electrical system 100 embodied as a power adapter circuit 203. More information regarding power adapters is provided below with FIGS. 10a-10c and FIGS. 11a-11d. The circuitry of power adapter circuit 203 is often included with many different types of power adapters, such as those used with cell phones and laptop computers. In this embodiment, power adapter circuit 203 includes a DC power supply which includes a diode bridge 166. The DC power supply receives AC signal $S_{AC}$ and output signal $S_{Output}$ is provided in response through a flyback, which includes a transformer 165. Power adapter circuit 203 includes a control circuit having a pulse wave modulator (PWM). The control circuit is connected to transformer 165. Further, the control circuit receives a feedback signal indication from output signal $S_{Output}$. It should be noted that a switch can be operatively coupled to an input of the control circuit, as will be discussed in more detail below.

Figure 6A:
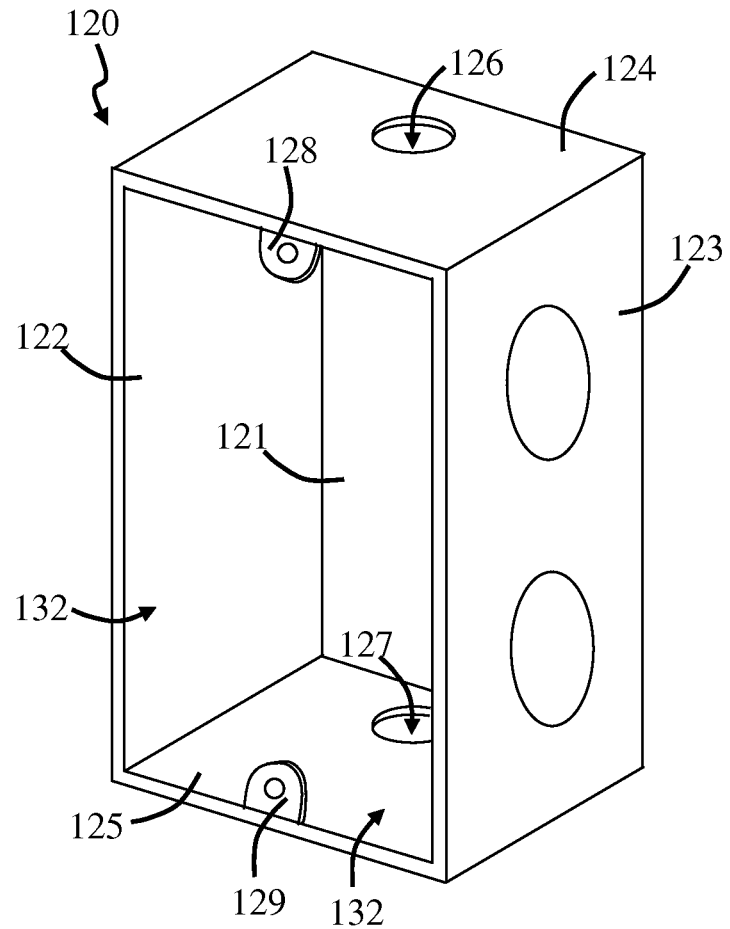
FIG. 6a is a perspective view of a light switch housing.

FIG. 6a is a perspective view of a light switch housing 120. It should be noted that light switch housings are sometimes referred to as light switch boxes. Light switch housings are disclosed in U.S. Pat. Nos. 3,864,561, 4,672,229, 6,051,787, 6,355,885 and 6,608,253, the contents of all of which are incorporated by reference as though fully set forth herein.

In this embodiment, light switch housing 120 includes a light switch housing backwall 121 with opposed light switch housing sidewalls 122 and 123 extending outwardly therefrom. Light switch housing 120 includes opposed light switch housing upper and lower walls 124 and 125 extending outwardly therefrom. Light switch housing upper wall 124 extends between upper portions of light switch housing sidewalls 122 and 123, and light switch housing lower wall 125 extends between lower portions of light switch housing sidewalls 122 and 123. Light switch housing sidewalls 122 and 123 and light switch housing upper and lower walls 124 and 125, as well as light switch housing backwall 121, bound a light switch housing inner volume 132.

In this embodiment, light switch housing 120 includes a light switch housing upper opening 126 which extends through light switch housing upper wall 124, and a light switch housing lower opening 127 which extends through light switch housing lower wall 125.

In this embodiment, light switch housing 120 includes a light switch housing upper mounting tab 128 which extends downwardly from light switch housing upper wall 124, and a light switch housing lower mounting tab 129 which extends upwardly from light switch housing lower wall 125. Light switch housing upper mounting tab 128 and light switch housing lower mounting tab 129 are for mounting to a light switch, one of which will be discussed in more detail presently.

Figure 6B:
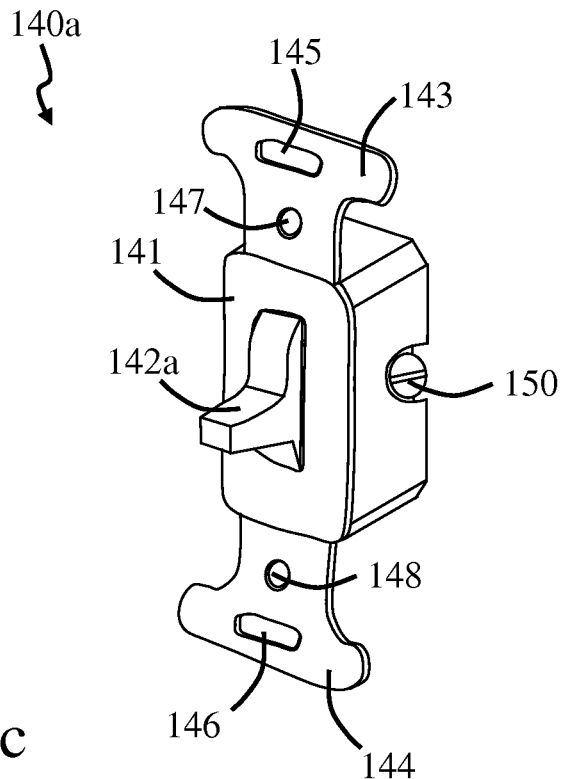
FIG. 6b is a perspective view of a light switch assembly.

FIG. 6b is a perspective view of a light switch assembly 140a. Light switch assembly 140a can be of many different types. For example a dimmer switch is disclosed in U.S. Pat. No. 3,864,561 and a touch switch is disclosed in U.S. Pat. No. 4,672,229, the contents of all of which are incorporated by reference as though fully set forth herein. In this embodiment, however, light switch assembly 140a is embodies as an ON/OFF switch. More information regarding light switch assembly 140a can be found in the above-identified related provisional applications.

In this embodiment, light switch assembly 140a includes a light switch body 141 which carries a light switch 142a. Light switch 142a is repeatably moveable between raised and lowered positions.

In this embodiment, light switch assembly 140a includes a light switch upper mounting tab 143. Light switch upper mounting tab slot 145 and light switch upper mounting tab opening 147 extend through light switch upper mounting tab 143.

In this embodiment, light switch assembly 140a includes a light switch lower mounting tab 144. Light switch lower mounting tab slot 146 and light switch lower mounting tab opening 148 extend through light switch lower mounting tab 144. Light switch upper mounting tab slot 145 and light switch lower mounting tab slot 146 are for mounting to light switch housing upper mounting tab 128 and light switch housing lower mounting tab 129, respectively. Light switch upper mounting tab opening 147 and light switch lower mounting tab opening 148 are for mounting to a light switch face plate, one of which will be discussed in more detail presently.

Figure 6C:
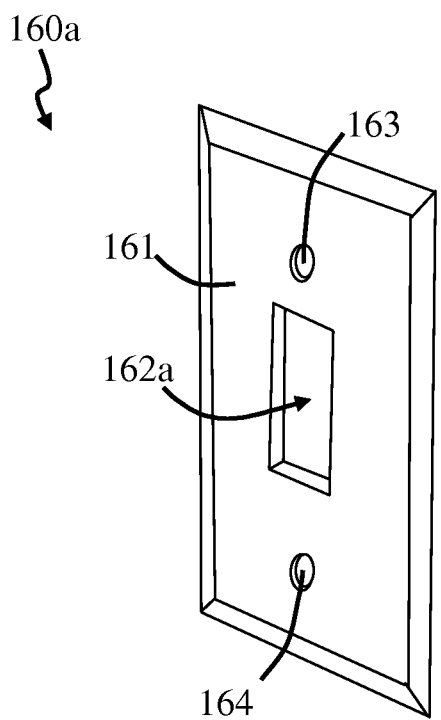
FIG. 6c is a perspective view of a light switch face plate.

FIG. 6c is a perspective view of a light switch face plate 160. In this embodiment, light switch face plate 160 includes a light switch plate body 161 with a light switch slot 162a extending therethrough. Light switch slot 162a is sized and shaped to receive light switch 142a. Light switch face plate 160 includes light switch mounting plate opening 163 and light switch mounting plate opening 164, which are positioned to align with light switch upper mounting tab opening 147 and light switch lower mounting tab opening 148, respectively. Light switch face plate 160 is mounted to light switch assembly 140a by extending a first fastener (not shown) through light switch mounting plate opening 163 and light switch upper mounting tab opening 147. Further, light switch face plate 160 is mounted to light switch assembly 140a by extending a second fastener (not shown) through light switch mounting plate opening 164 and light switch lower mounting tab opening 148. The first and second fasteners can be of many different types of fasteners, such as screws. It should be noted that light switch face plate 160 covers light switch housing inner volume 132 when light switch face plate 160 is mounted to light switch assembly 140a and light switch assembly 140a is mounted to light switch housing 120.

Figure 6D:
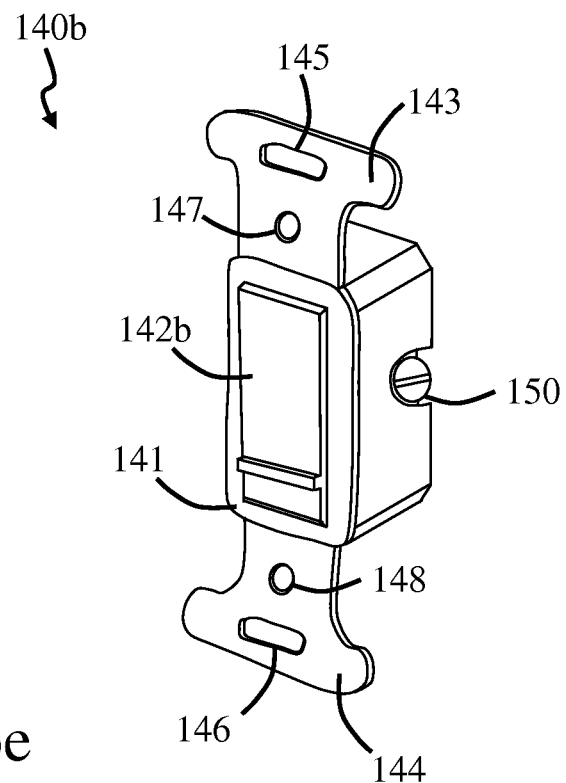
FIG. 6d is an embodiment of a dimmer switch assembly.

FIG. 6d is an embodiment of a dimmer switch assembly 140b. In this embodiment, dimmer switch assembly 140b is similar to light switch assembly 140a. Dimmer switch assembly 140b includes a dimmer switch 142b which replaces light switch 142a of light switch assembly 140a. More information regarding dimmer switch assembly 140b and its operation can be found in U.S. Pat. No. 3,864,561, as well as in the above-identified related provisional applications.

Figure 6E:
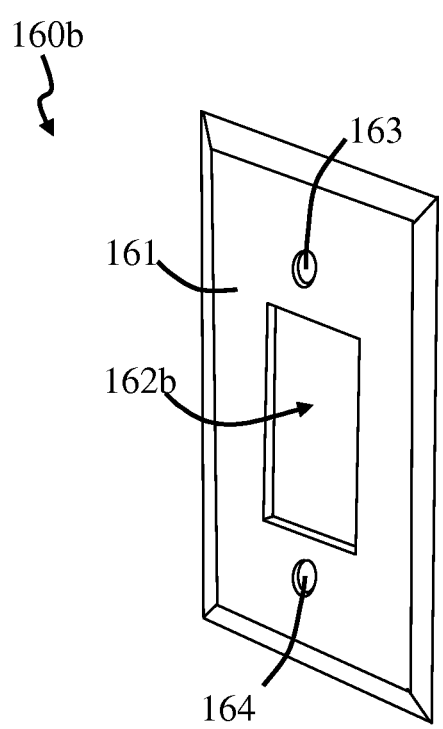
FIG. 6e is a perspective view of a dimmer switch face plate.

FIG. 6e is a perspective view of a dimmer switch face plate 160b. In this embodiment, dimmer switch face plate 160b is similar to light switch face plate 160a. Dimmer switch face plate 160b includes a dimmer switch slot 162b, which is sized and shaped to receive dimmer switch 142b. More information regarding dimmer switch face plates can be found in the above-identified related provisional applications.

Figure 7A:
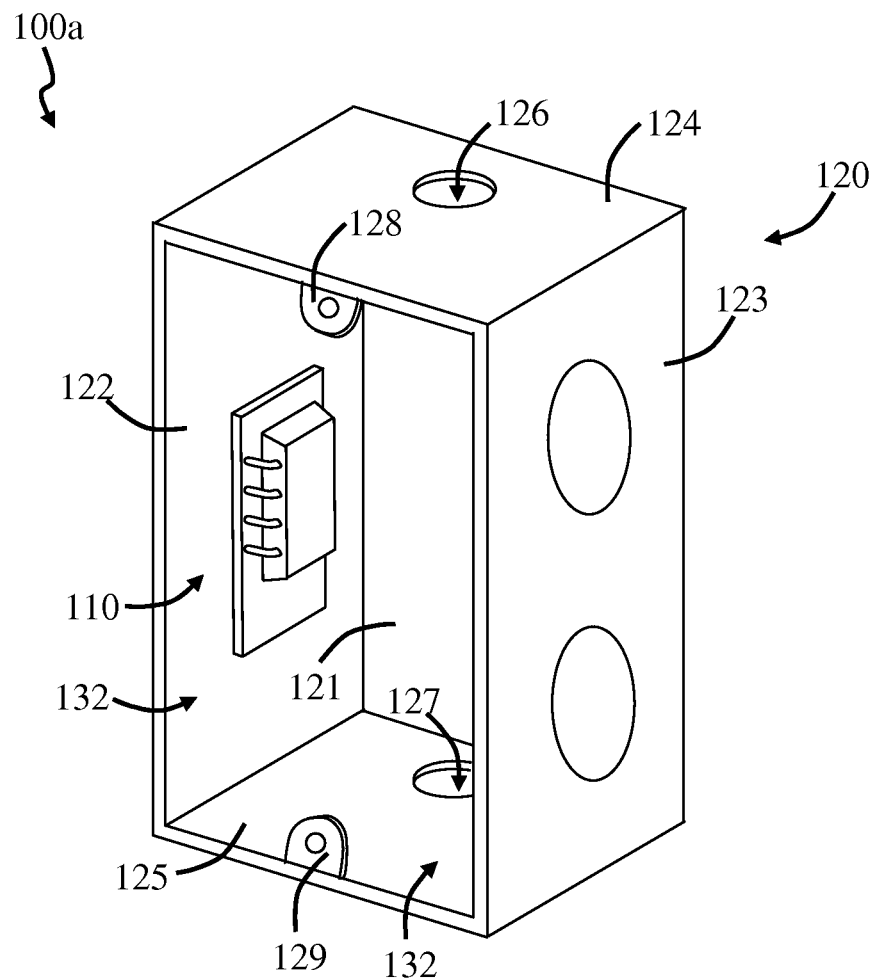

FIG. 7a is a perspective view of one embodiment of electrical system 100, which is denoted as electrical system 100a. In this embodiment, electrical system 100a includes control assembly 110 carried by light switch housing 120 (FIG. 6a), wherein control assembly 110 is as shown in FIG. 5a. It should be noted, however, that, in other embodiments control assembly 110 of FIG. 7a is as shown in FIG. 5b.

In this embodiment, control assembly 110 is housed by light switch housing 120 because control assembly 110 extends through light switch housing inner volume 132. Control assembly 110 can be carried by light switch housing 120 in many different ways. In this embodiment, control assembly 110 is attached to light switch housing sidewall 122. In other embodiments, control assembly 110 is attached to light switch housing sidewall 123. In other embodiments, control assembly 110 is attached to light switch housing upper wall 124 or light switch housing upper lower 125. It should be noted that electrical system 100a of FIG. 7a typically includes a switch assembly operatively coupled to control assembly 110, as will be discussed in more detail presently.

Figure 7B:
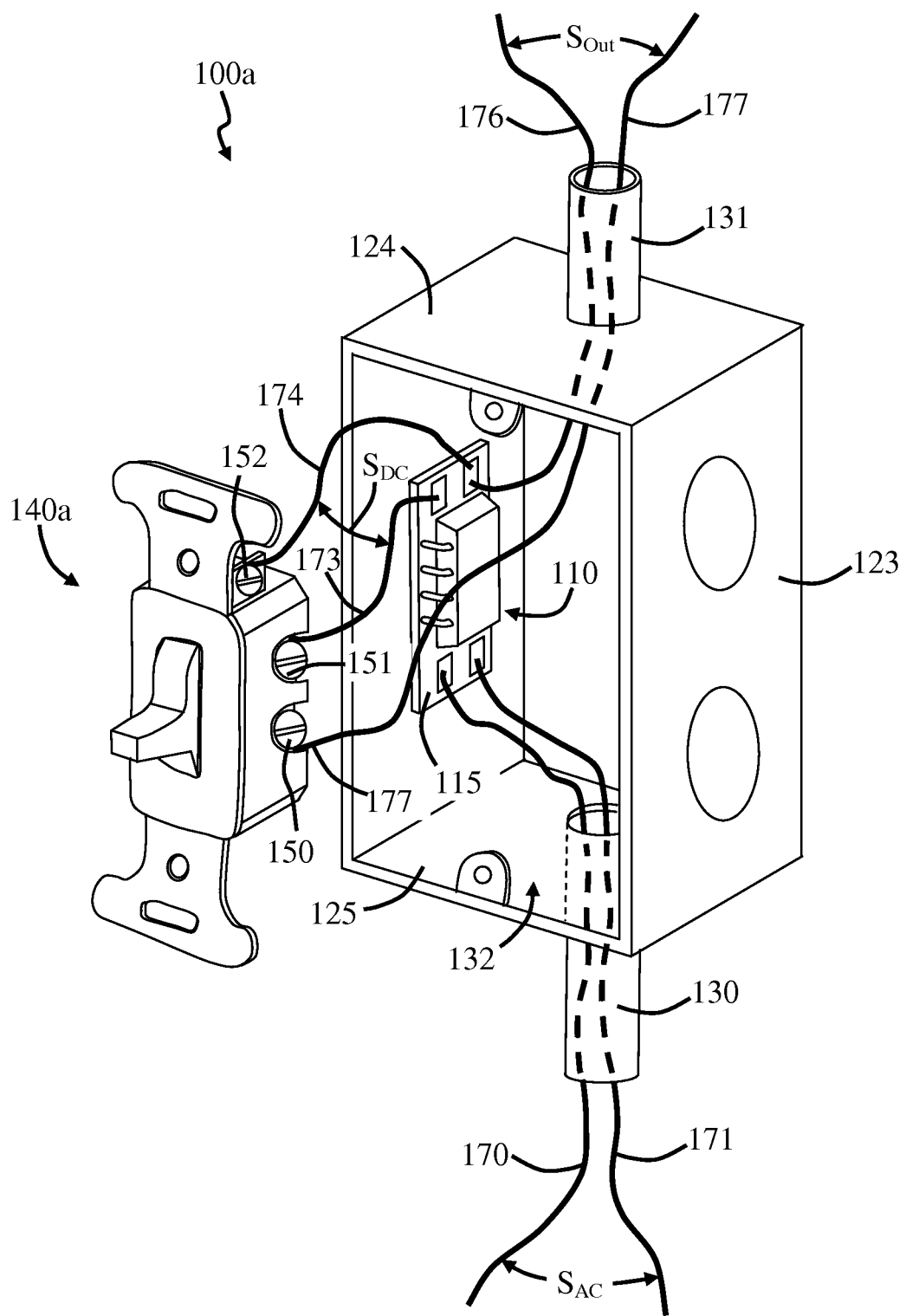
FIGS. 7b and 7c are perspective views of the electrical system of FIG. 5a carried by the light switch housing of FIG. 6a and operatively coupled to the light switch assembly of FIG. 6b.

FIG. 7b is a perspective view of electrical system 100a of FIG. 7a with light switch assembly 140a (FIG. 6b) operatively coupled to control assembly 110. In this embodiment, light switch assembly 140a includes terminals 150, 151 and 152. A conductive line 177 is connected to terminal 150, a conductive line 173 is connected to terminal 151 and a conductive line 174 is connected to terminal 152. Conductive line 177 extends through upper conduit 131 of light switch housing 120, which extends upwardly from light switch housing upper wall 124. Further, conductive lines 173 and 174 are connected to circuit board terminals 115 and 116, respectively, which are shown in more detail in FIG. 5a.

In this embodiment, electrical system 100a includes a conducive line 176 connected to circuit board terminal 116, wherein conducive line 176 extends through upper conduit 131. Further, electrical system 100a includes conductive lines 170 and 171 which are connected to circuit board terminals 117 and 118, respectively. Circuit board terminals 117 and 118 are shown in more detail in FIG. 5a. Conductive lines 170 and 171 extend through a lower conduit 130 of light switch housing 120, which extends downwardly from light switch housing lower wall 125.

In this embodiment, AC signal $S_{AC}$ flows between conductive lines 170 and 171 to circuit board terminals 117 and 118. Further, DC signal $S_{DC}$ flows between conductive lines 173 and 174 to circuit board terminals 115 and 116. Output signal $S_{Output}$ flows between conductive lines 176 and 177. More information regarding AC signal $S_{AC}$, DC signal $S_{DC}$ and output signal $S_{Output}$ is provided above with FIGS. 2a-2e. It should be noted that, in some embodiments, output signal $S_{Output}$ includes control signal $S_{Control}$, as discussed with FIG. 2e.

Figure 7C:
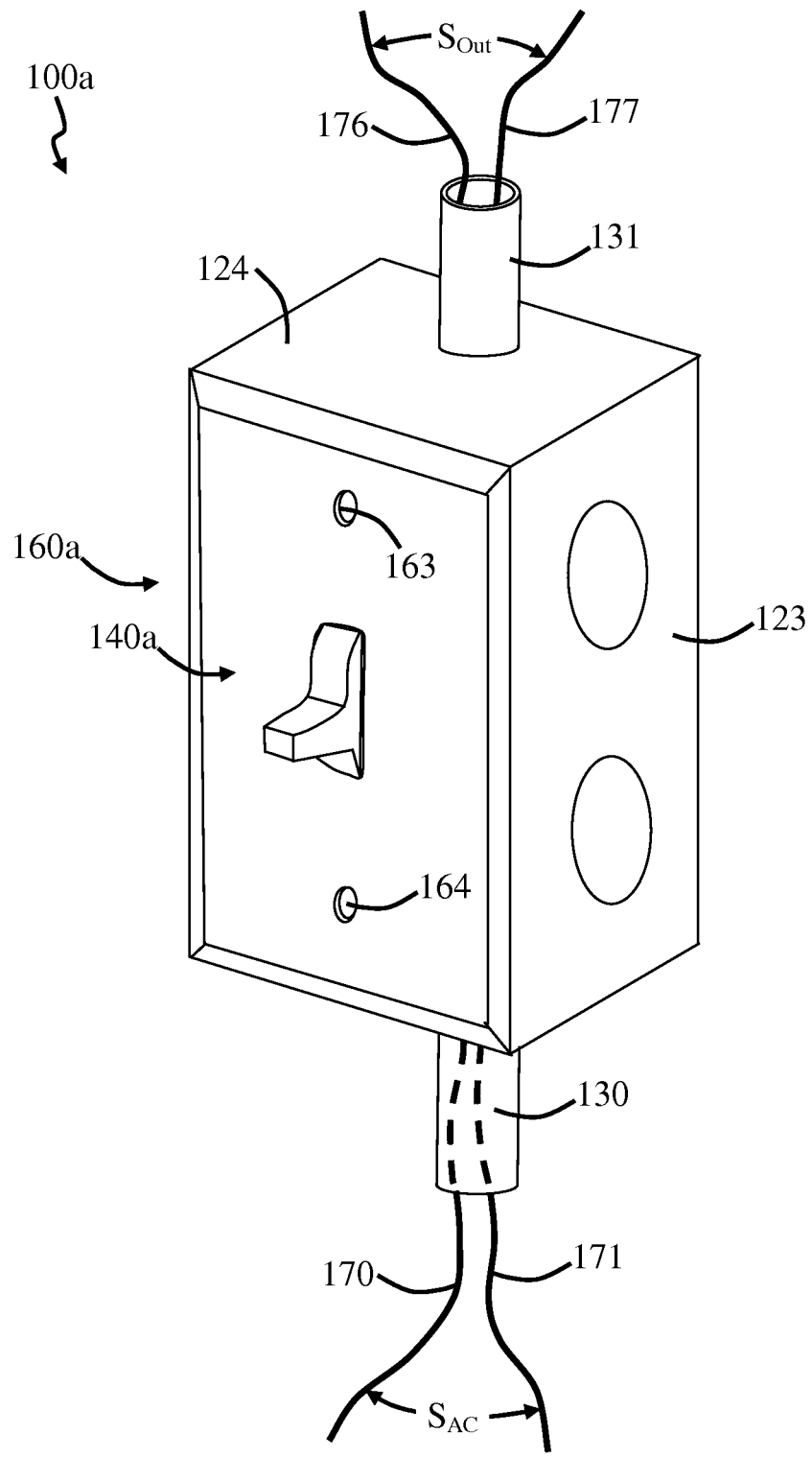

FIG. 7c is a perspective view of electrical system 100a of FIGS. 7a and 7b with light switch assembly 140a operatively coupled to control assembly 110 and mounted to light switch housing 120. In operation, output signal $S_{Out}$ is provided in response to light switch assembly 140a being activated. Further, output signal $S_{Out}$ is not provided in response to light switch assembly 140a being deactivated.

Figure 8A:
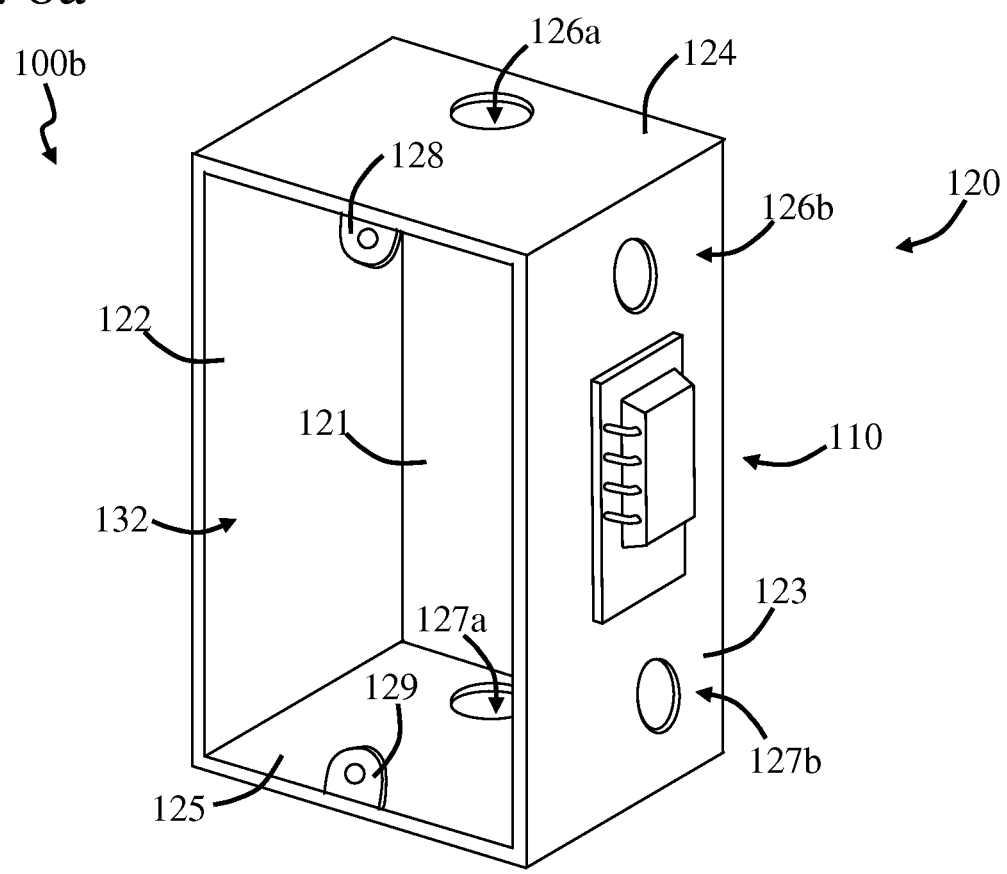

FIG. 8a is a perspective view of one embodiment of electrical system 100, which is denoted as electrical system 100b. In this embodiment, electrical system 100b includes control assembly 110 carried by light switch housing 120 (FIG. 6a), wherein control assembly 110 is as shown in FIG. 5a. It should be noted, however, that, in other embodiments control assembly 110 is as shown in FIG. 5b.

In this embodiment, control assembly 110 is not housed by light switch housing 120 because control assembly 110 does not extend through light switch housing inner volume 132. Control assembly 110 can be carried by light switch housing 120 in many different ways. In this embodiment, control assembly 110 is attached to light switch housing sidewall 123. In other embodiments, control assembly 110 is attached to light switch housing sidewall 122. In other embodiments, control assembly 110 is attached to light switch housing upper wall 124 or light switch housing upper lower 125. It should be noted that light switch housing upper opening 126a and light switch housing lower opening 127a which extend through light switch housing sidewall 123. It should also be noted that electrical system 100b of FIG. 8a typically includes a switch assembly operatively coupled to control assembly 110, as will be discussed in more detail presently.

Figure 8B:
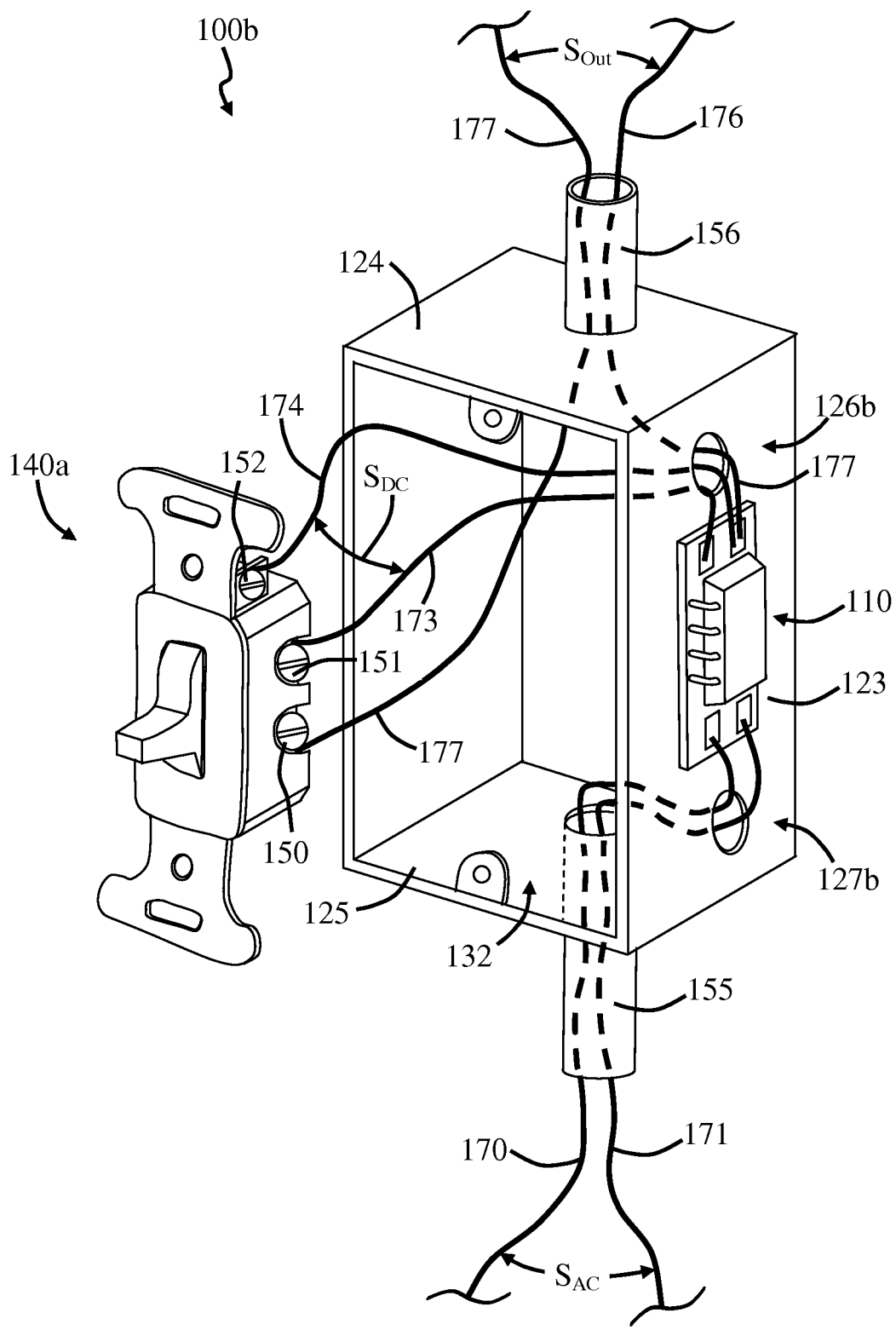
FIGS. 8b and 8c are perspective views of the electrical system of FIG. 5a carried by the light switch housing of FIG. 6a and operatively coupled to the light switch assembly of FIG. 6b.

FIG. 8b is a perspective view of electrical system 100b of FIG. 8a with light switch assembly 140a (FIG. 6b) operatively coupled to control assembly 110. In this embodiment, light switch assembly 140a includes terminals 150, 151 and 152. Conductive line 177 is connected to terminal 150, conductive line 173 is connected to terminal 151 and conductive line 174 is connected to terminal 152. Conductive line 177 extends through upper conduit 131 of light switch housing 120, which extends upwardly from light switch housing upper wall 124. Further, conductive lines 173 and 174 extend through light switch housing upper opening 126a and are connected to circuit board terminals 115 and 116, respectively, which are shown in more detail in FIG. 5a.

In this embodiment, electrical system 100b includes conducive line 177 connected to circuit board terminal 116, wherein conducive line 177 extends through upper conduit 131. Further, electrical system 100b includes conductive lines 170 and 171 which are connected to circuit board terminals 117 and 118, respectively. Conductive lines 170 and 171 extend through lower conduit 130 of light switch housing 120, which extends downwardly from light switch housing lower wall 125.

In this embodiment, AC signal $S_{AC}$ flows between conductive lines 170 and 171 to circuit board terminals 117 and 118. Further, DC signal $S_{DC}$ flows between conductive lines 173 and 174 to circuit board terminals 115 and 116. Output signal $S_{Output}$ flows between conductive lines 176 and 177. More information regarding AC signal $S_{AC}$, DC signal $S_{DC}$ and output signal $S_{Output}$ is provided above with FIGS. 2a-2e. It should be noted that, in some embodiments, output signal $S_{Output}$ includes control signal $S_{Control}$, as discussed with FIG. 2e.

Figure 8C:
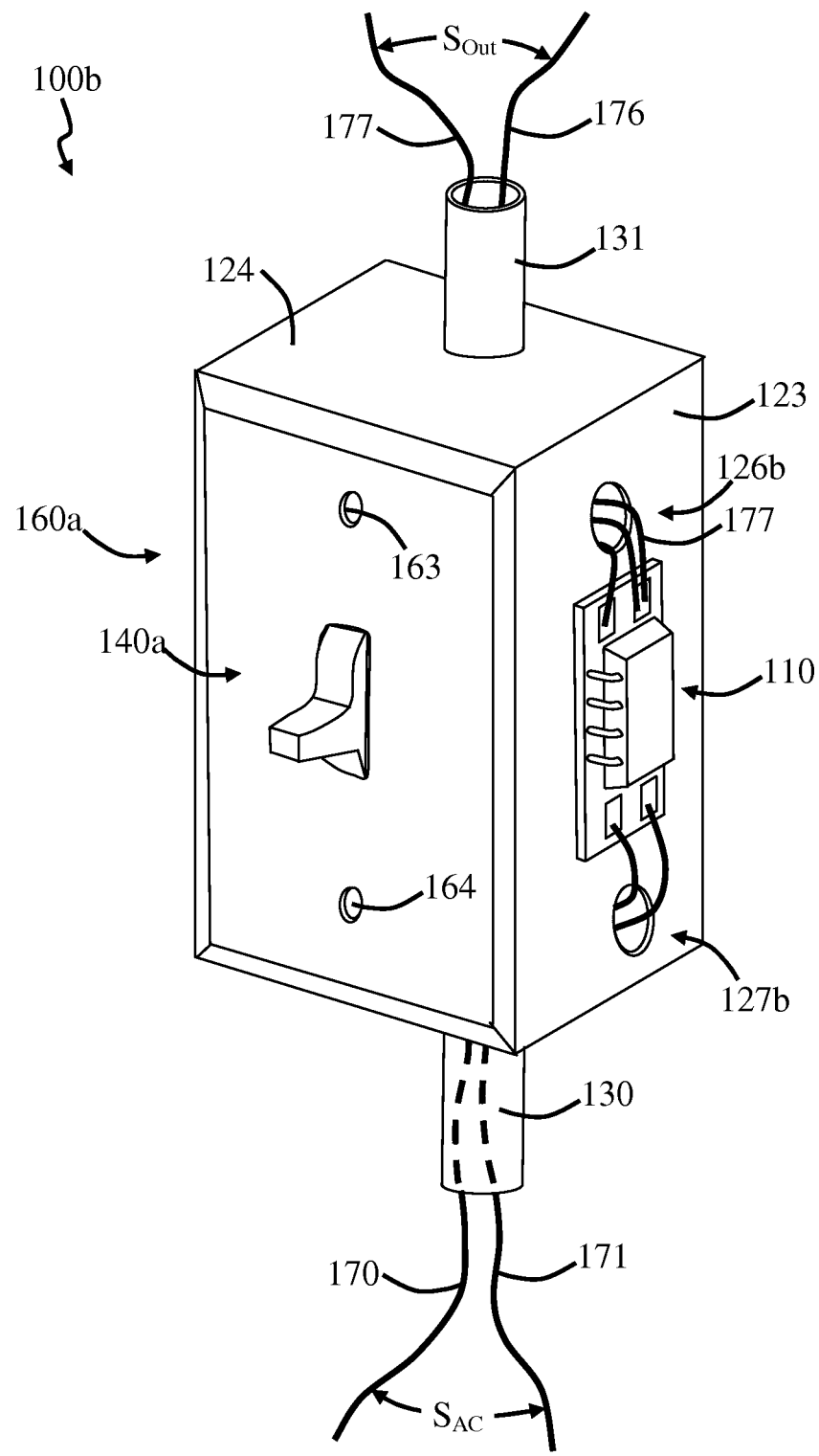

FIG. 8c is a perspective view of electrical system 100b of FIGS. 8a and 8b with light switch assembly 140a operatively coupled to control assembly 110 and mounted to light switch housing 120. In operation, output signal $S_{Out}$ is provided in response to light switch assembly 140a being activated. Further, output signal $S_{Out}$ is not provided in response to light switch assembly 140a being deactivated.

Figure 9A:
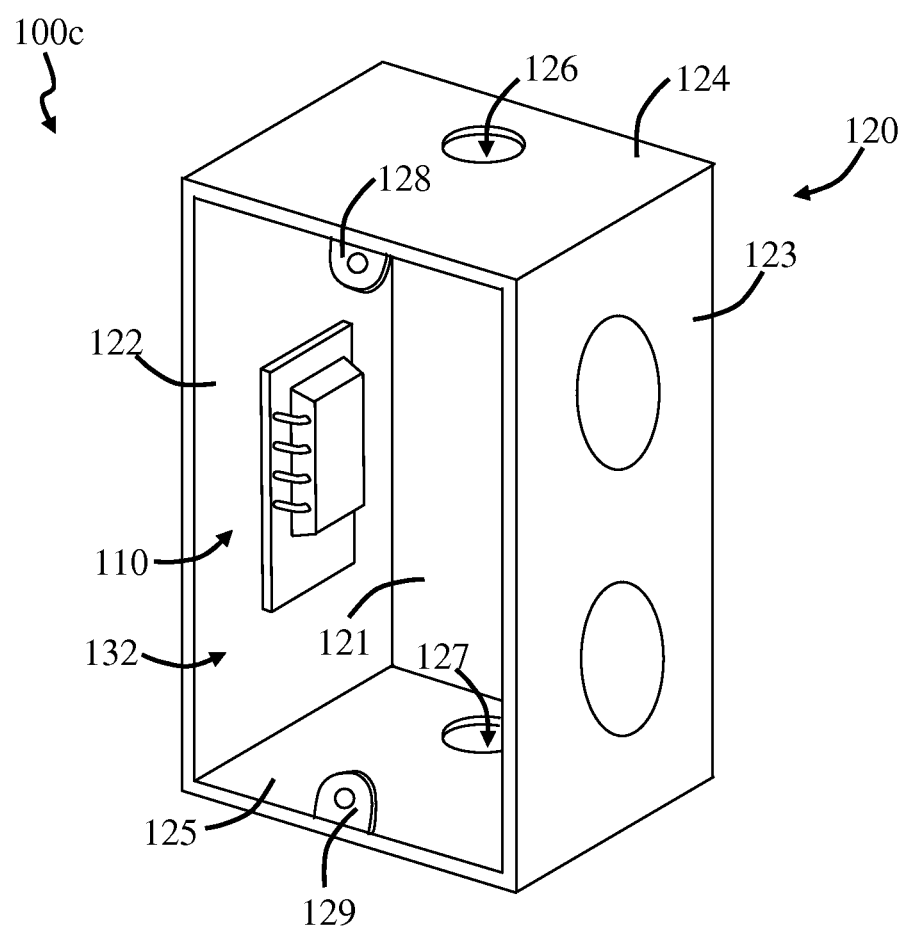

FIG. 9a is a perspective view of one embodiment of electrical system 100, which is denoted as electrical system 100c. In this embodiment, electrical system 100c includes control assembly 110 carried by light switch housing 120 (FIG. 6a), wherein control assembly 110 is as shown in FIG. 5a. It should be noted, however, that, in other embodiments control assembly 110 of FIG. 9a is as shown in FIG. 5b.

In this embodiment, control assembly 110 is housed by light switch housing 120 because control assembly 110 extends through light switch housing inner volume 132. Control assembly 110 can be carried by light switch housing 120 in many different ways. In this embodiment, control assembly 110 is attached to light switch housing sidewall 122. In other embodiments, control assembly 110 is attached to light switch housing sidewall 123. In other embodiments, control assembly 110 is attached to light switch housing upper wall 124 or light switch housing upper lower 125. It should be noted that electrical system 100c of FIG. 9a typically includes a switch assembly operatively coupled to control assembly 110, as will be discussed in more detail presently.

Figure 9B:
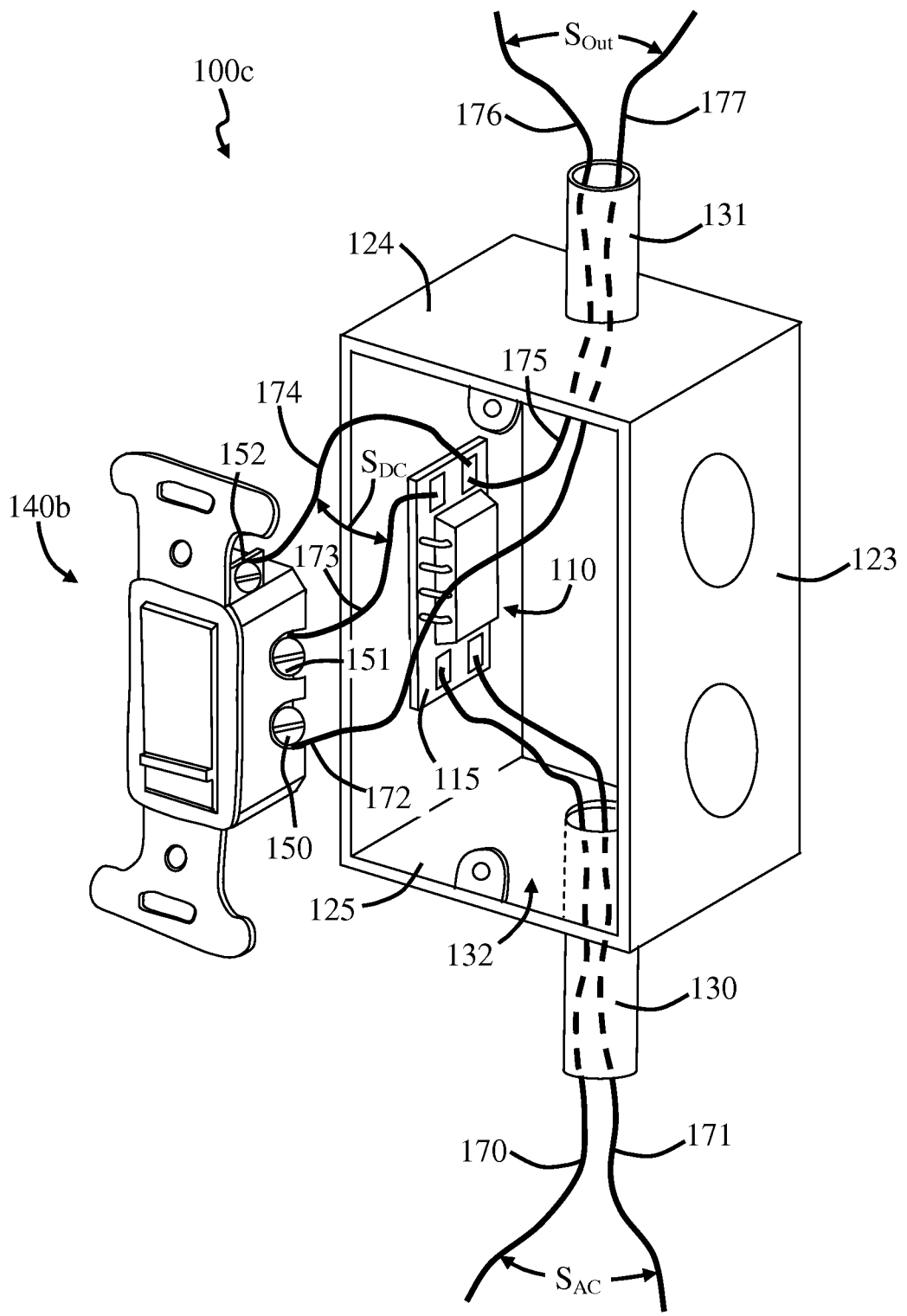
FIGS. 9b and 9c are perspective views of the electrical system of FIG. 5a carried by the light switch housing of FIG. 6a and operatively coupled to the dimmer switch assembly of FIG. 6d.

FIG. 9b is a perspective view of electrical system 100c of FIG. 9a with dimmer switch assembly 140b (FIG. 6d) operatively coupled to control assembly 110. In this embodiment, light switch assembly 140b includes terminals 150, 151 and 152. A conductive line 177 is connected to terminal 150, a conductive line 173 is connected to terminal 151 and a conductive line 174 is connected to terminal 152. Conductive line 177 extends through upper conduit 131 of light switch housing 120, which extends upwardly from light switch housing upper wall 124. Further, conductive lines 173 and 174 are connected to circuit board terminals 115 and 116, respectively, which are shown in more detail in FIG. 5a.

In this embodiment, electrical system 100c includes a conducive line 176 connected to circuit board terminal 116, wherein conducive line 176 extends through upper conduit 131. Further, electrical system 100c includes conductive lines 170 and 171 which are connected to circuit board terminals 117 and 118, respectively. Circuit board terminals 117 and 118 are shown in more detail in FIG. 5a. Conductive lines 170 and 171 extend through a lower conduit 130 of light switch housing 120, which extends downwardly from light switch housing lower wall 125.

In this embodiment, AC signal $S_{AC}$ flows between conductive lines 170 and 171 to circuit board terminals 117 and 118. Further, DC signal $S_{DC}$ flows between conductive lines 173 and 174 to circuit board terminals 115 and 116. Output signal $S_{Output}$ flows between conductive lines 176 and 177. More information regarding AC signal $S_{AC}$, DC signal $S_{DC}$ and output signal $S_{Output}$ is provided above with FIGS. 2a-2e. It should be noted that, in some embodiments, output signal $S_{Output}$ includes control signal $S_{Control}$, as discussed with FIG. 2e.

Figure 9C:
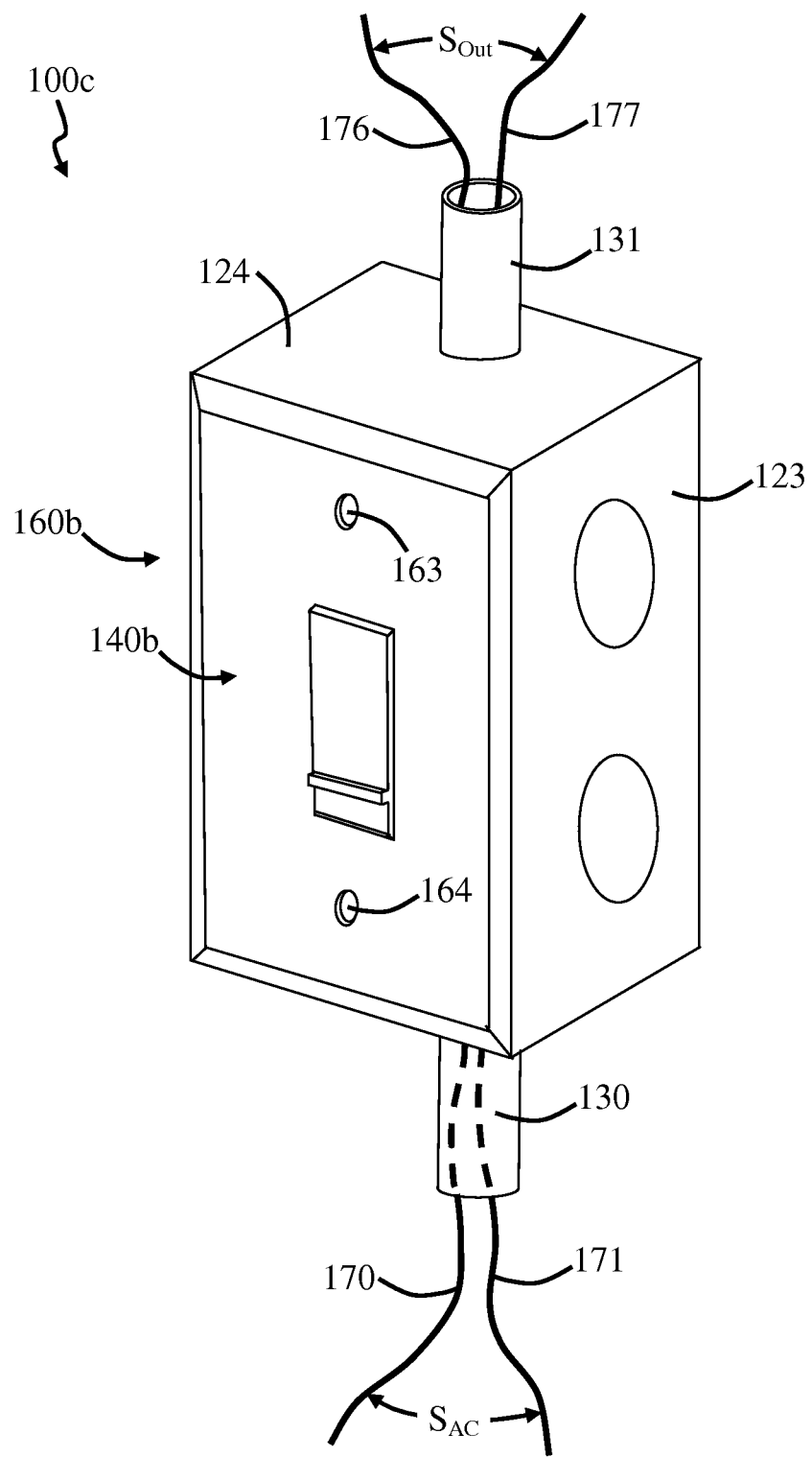

FIG. 9c is a perspective view of electrical system 100c of FIGS. 9a and 9b with dimmer switch assembly 140b operatively coupled to control assembly 110 and mounted to light switch housing 120. In operation, output signal $S_{Out}$ is provided in response to dimmer switch assembly 140b being adjusted.

Figure 10A:
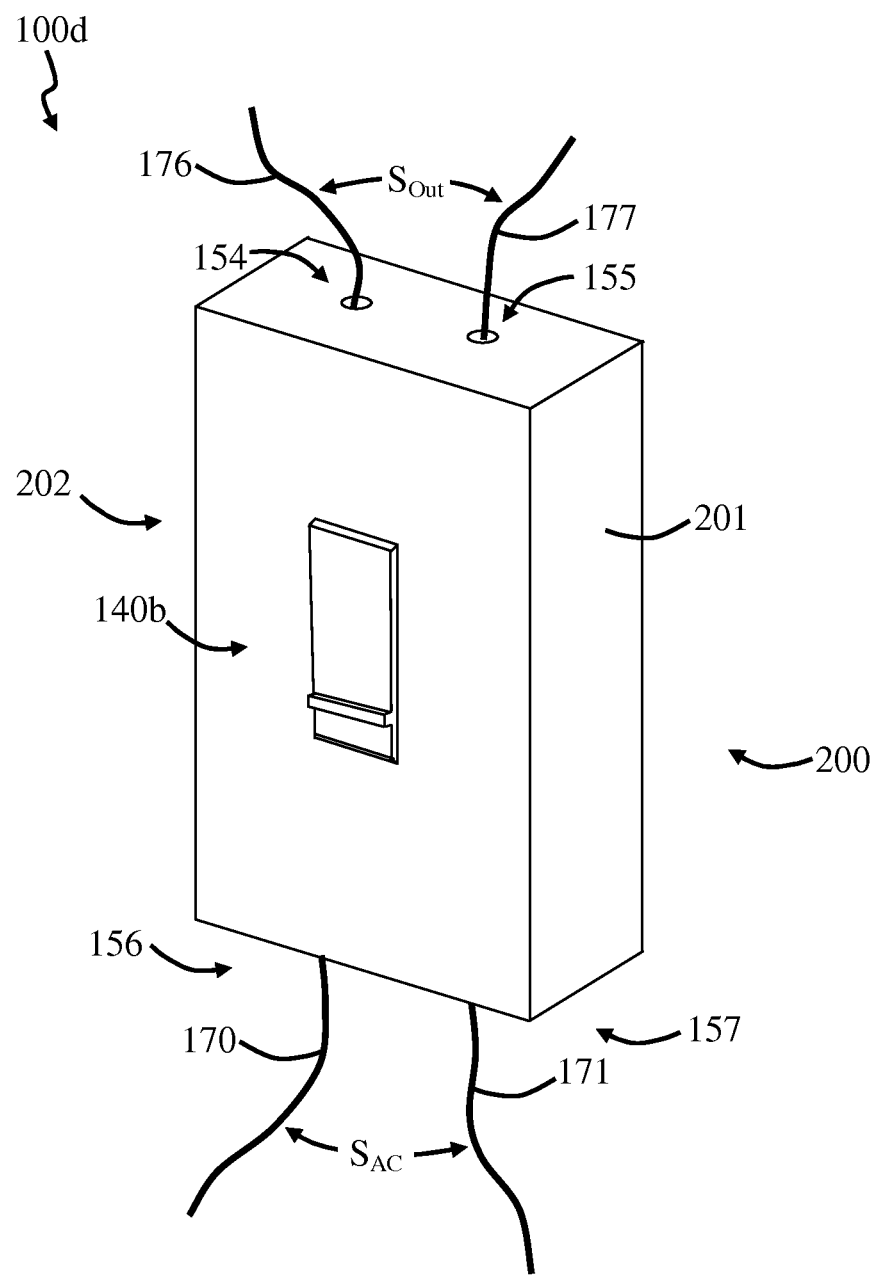
FIG. 10a is a perspective view of one embodiment of an electrical system, which includes a power adapter.

FIG. 10a is a perspective view of electrical system 100, which is denoted as electrical system 100d. In this embodiment, electrical system 100d includes power adapter 200 having a power adapter circuit 202 which is carried by a power adapter housing 201. Power adapter circuit 202 can be of many different types of power adapter circuits, such as those included with power cords for cell phones and laptop computers. More information regarding power adapter circuits is provided in the above-identified related provisional applications, as well as in some of the references cited herein. In this embodiment, power adapter circuit 202 includes power adapter circuit 203 of FIG. 5c. Electrical system 100d includes dimmer switch assembly 140b operatively coupled to power adapter circuit 203. In particular, electrical system 100d includes dimmer switch assembly 140b operatively coupled to an input of pulse wave modulator 167.

In this embodiment, conductive lines 170 and 171 extend through lower power adapter housing openings 156 and 157, respectively. Further, conductive lines 176 and 177 extend through upper power adapter housing openings 154 and 155, respectively. Conductive lines 170, 171, 176 and 177 are in communication with power adapter circuit 202. AC signal $S_{AC}$ is provided to power adapter circuit 202 through conductive lines 170 and 171, and output signal $S_{Output}$ is flowed from power adapter circuit 202 through conductive lines 176 and 177. More information regarding AC signal $S_{AC}$, DC signal $S_{DC}$ and output signal $S_{Output}$ is provided above with FIGS. 2a-2e. It should be noted that, in some embodiments, output signal $S_{Output}$ includes control signal $S_{Control}$, as discussed with FIG. 2e.

Figure 10B:
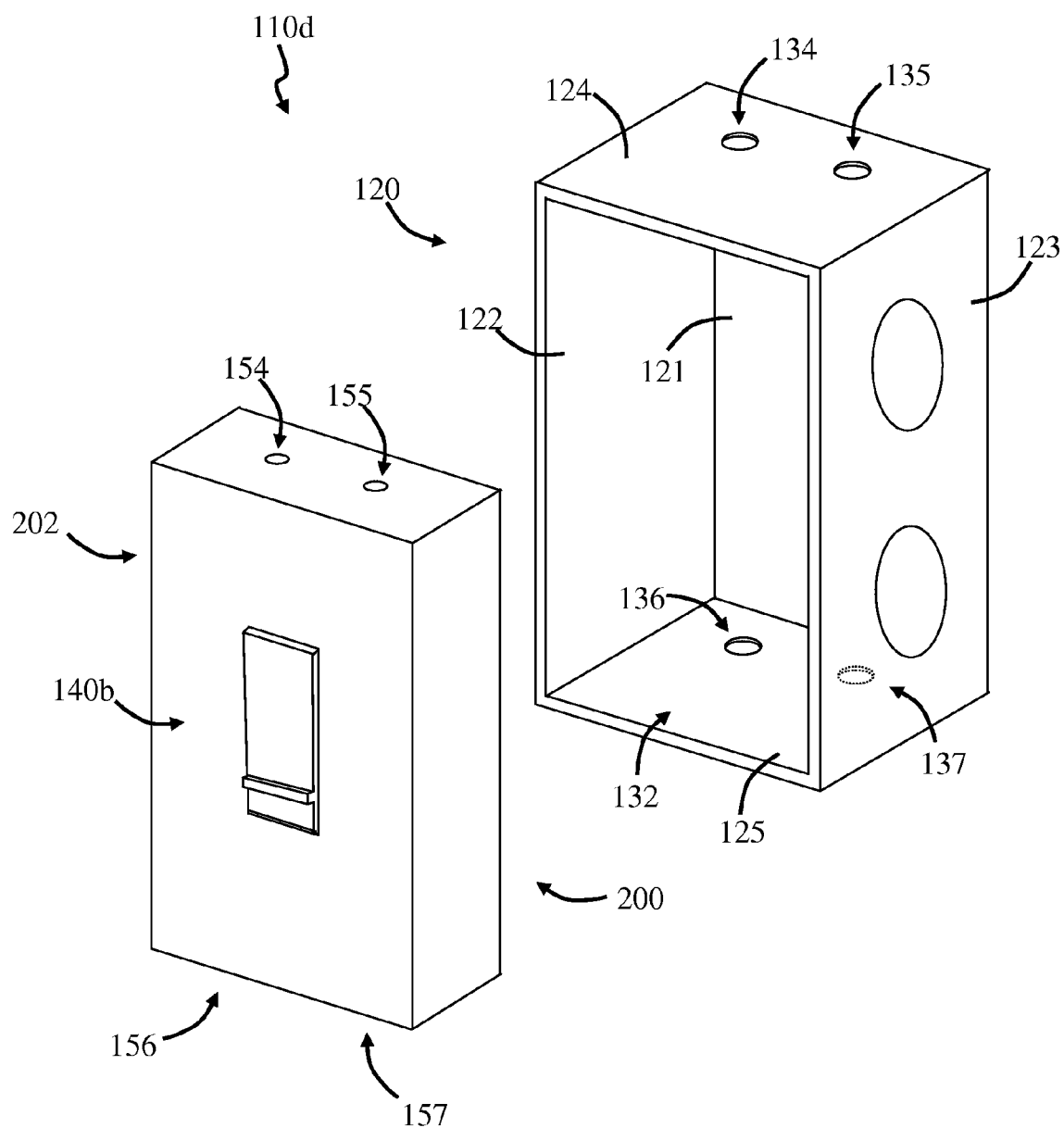

FIG. 10b is a perspective view of electrical system 100d of FIG. 10a, wherein power adapter 200 is positioned proximate to light switch housing 120 (FIG. 6a). In this embodiment, light switch housing 120 includes upper light switch housing openings 134 and 135, which extend through light switch housing upper wall 124. Upper light switch housing openings 134 and 135 are positioned so that align with upper power adapter housing openings 154 and 155 in response to power adapter 200 being received by light switch housing inner volume 132. Further, light switch housing 120 includes lower light switch housing openings 136 and 137, which extend through light switch housing lower wall 125. Lower light switch housing openings 136 and 137 are positioned so that align with lower power adapter housing openings 156 and 157 in response to power adapter 200 being received by light switch housing inner volume 132.

Figure 10C:
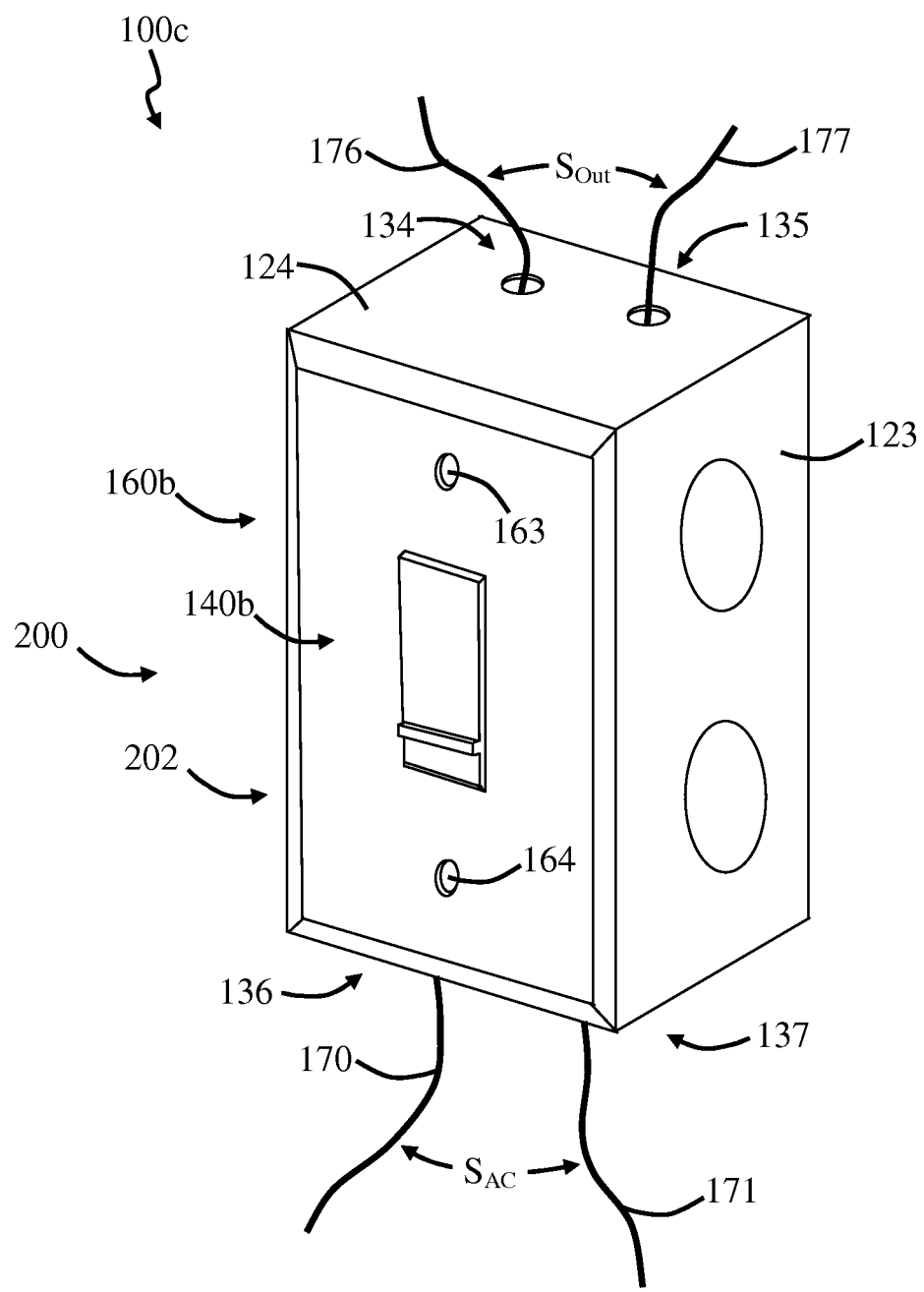

FIG. 10c is a perspective view of electrical system 100d of FIGS. 10a and 10b, wherein power adapter 200 is received by light switch housing inner volume 132 so that upper light switch housing openings 134 and 135 are aligned with upper power adapter housing openings 154 and 155 and lower light switch housing openings 136 and 137 are aligned with lower power adapter housing openings 156 and 157. In this way, conductive lines 176 and 177 extend through upper light switch housing openings 134 and 135, respectively, and conductive lines 170 and 171 extend through lower light switch housing openings 136 and 137, respectively. In operation, output signal $S_{Out}$ is provided in response to dimmer switch assembly 140b being adjusted.

Figure 11A:
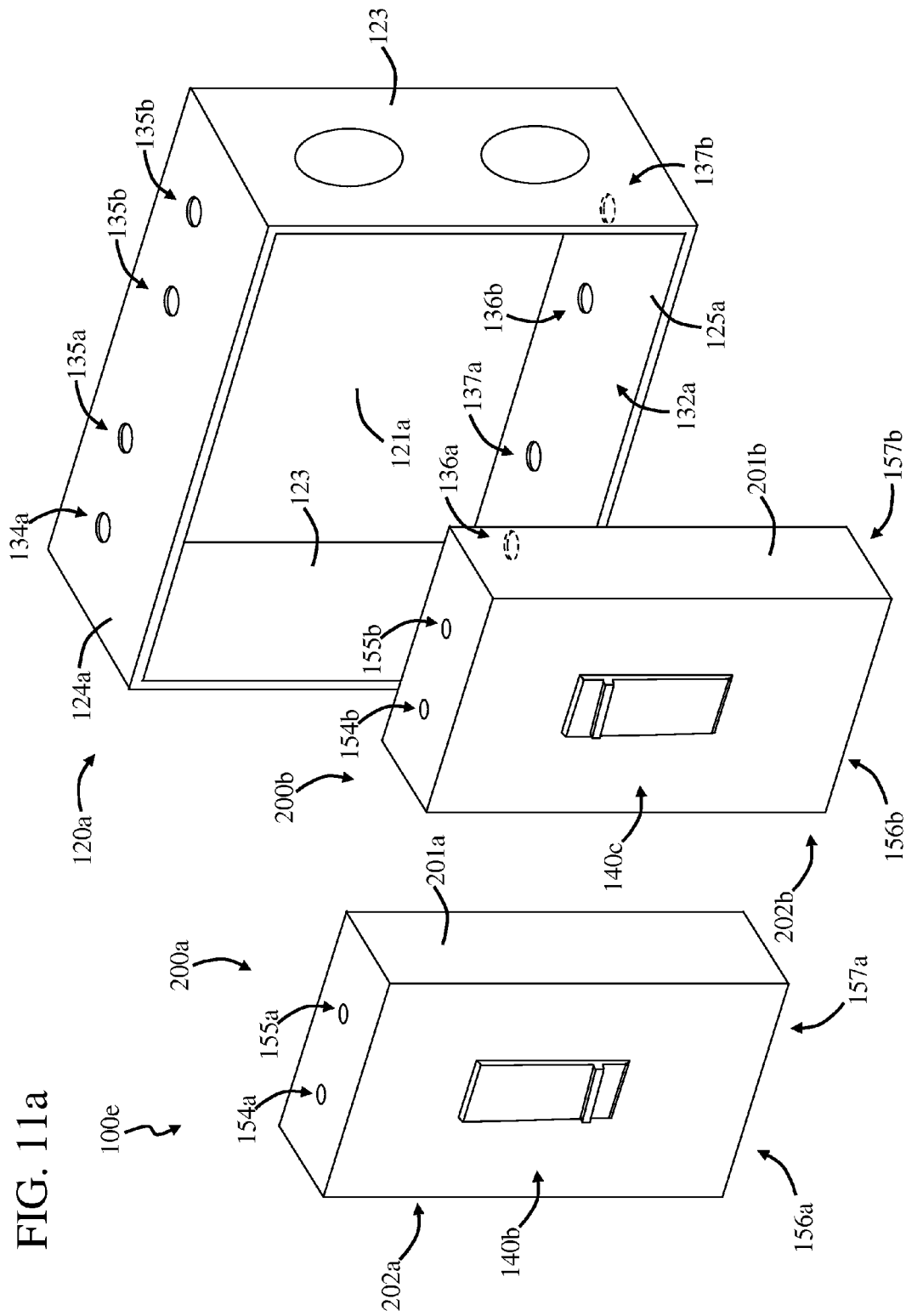
FIGS. 11a, 11b, 11c and 11d are different embodiments of power adapters and light switch housings.
Figure 11B:
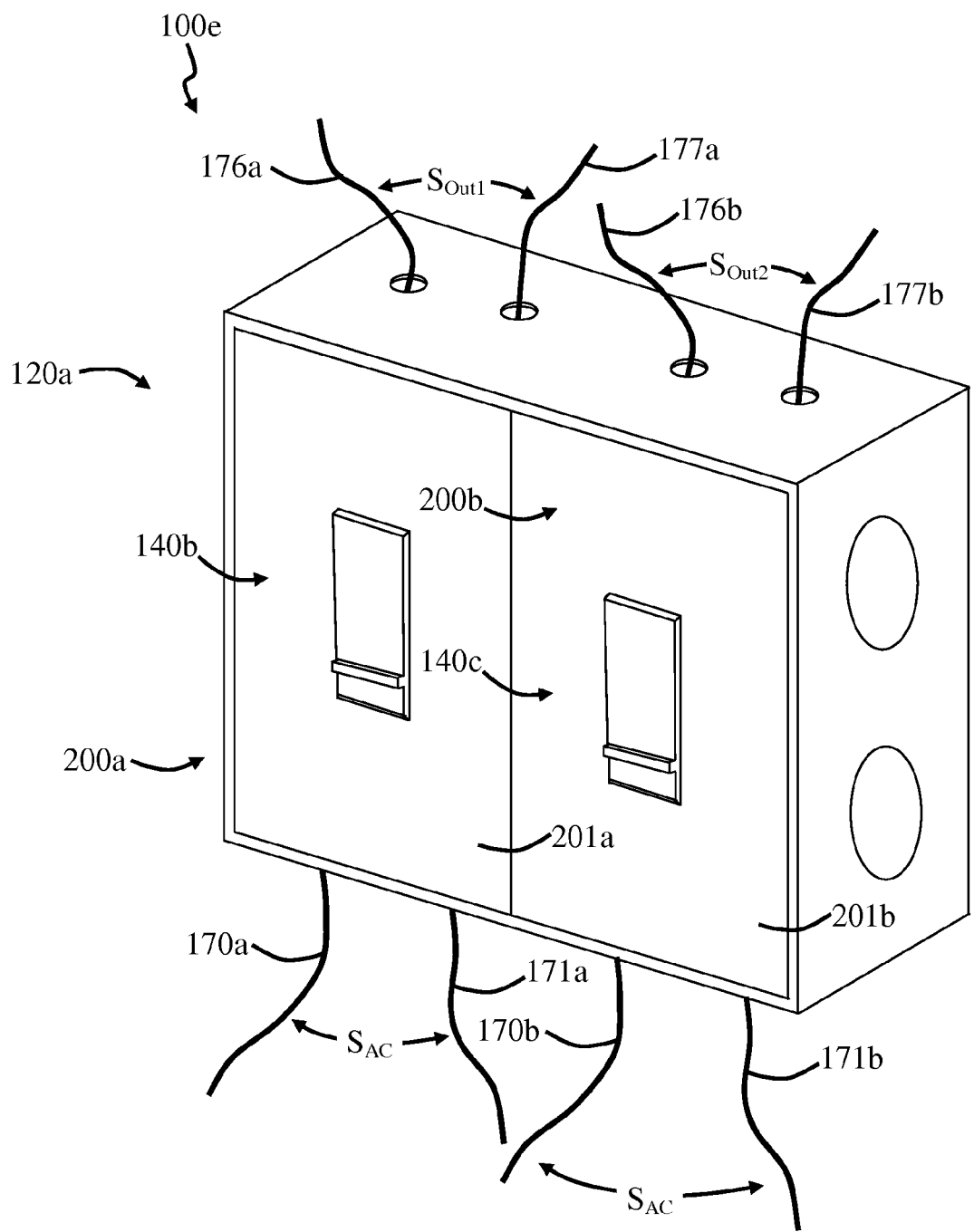

FIGS. 11a and 11b are perspective views of electrical system 100, which is denoted as electrical system 100e. In this embodiment, electrical system 100e includes power adapters 200a and 200b, with each having power adapter circuit 202a and 202b, respectively. Power adapter circuits 202a and 202b are carried by power adapter housings 201a and 201b. Power adapter circuits 202a and 202b can be of many different types of power adapter circuits, such as those included with power cords for cell phones and laptop computers. More information regarding power adapter circuits is provided in the above-identified related provisional applications, as well as in some of the references cited herein. In this embodiment, power adapter circuits 202a and 202b include power adapter circuit 203 of FIG. 5c. Electrical system 100e includes dimmer switch assembly 140b operatively coupled to power adapter circuit 202a, and dimmer switch assembly 140c operatively coupled to power adapter circuit 202b.

In this embodiment, conductive lines 170a and 171a extend through lower power adapter housing openings 156a and 157a, respectively, as indicated in FIG. 11b. Further, conductive lines 176a and 177a extend through upper power adapter housing openings 154a and 155a, respectively, as indicated in FIG. 11b. Conductive lines 170a, 171a, 176a and 177a are in communication with power adapter circuit 202a. AC signal $S_{AC}$ is provided to power adapter circuit 202a through conductive lines 170a and 171a, and output signal $S_{Out1}$ is flowed from power adapter circuit 202a through conductive lines 176a and 177a. More information regarding AC signal $S_{AC}$, DC signal $S_{DC}$ and output signal $S_{Out1}$ is provided above with FIGS. 2a-2e. It should be noted that, in some embodiments, output signal $S_{Out1}$ includes control signal $S_{Control}$, as discussed with FIG. 2e.

In this embodiment, conductive lines 170b and 171b extend through lower power adapter housing openings 156b and 157b, respectively, as indicated in FIG. 11b. Further, conductive lines 176b and 177b extend through upper power adapter housing openings 154b and 155b, respectively, as indicated in FIG. 11b. Conductive lines 170b, 171b, 176b and 177b are in communication with power adapter circuit 202b. AC signal $S_{AC}$ is provided to power adapter circuit 202b through conductive lines 170b and 171b, and output signal $S_{Out2}$ is flowed from power adapter circuit 202b through conductive lines 176b and 177b. More information regarding AC signal $S_{AC}$, DC signal $S_{DC}$ and output signal $S_{Out2}$ is provided above with FIGS. 2a-2e. It should be noted that, in some embodiments, output signal $S_{Out2}$ includes control signal $S_{Control}$, as discussed with FIG. 2e. In operation, output signal $S_{Out1}$ is provided in response to dimmer switch assembly 140b being adjusted. Further, output signal $S_{Out2}$ is provided in response to dimmer switch assembly 140c being adjusted.

Figure 11C:
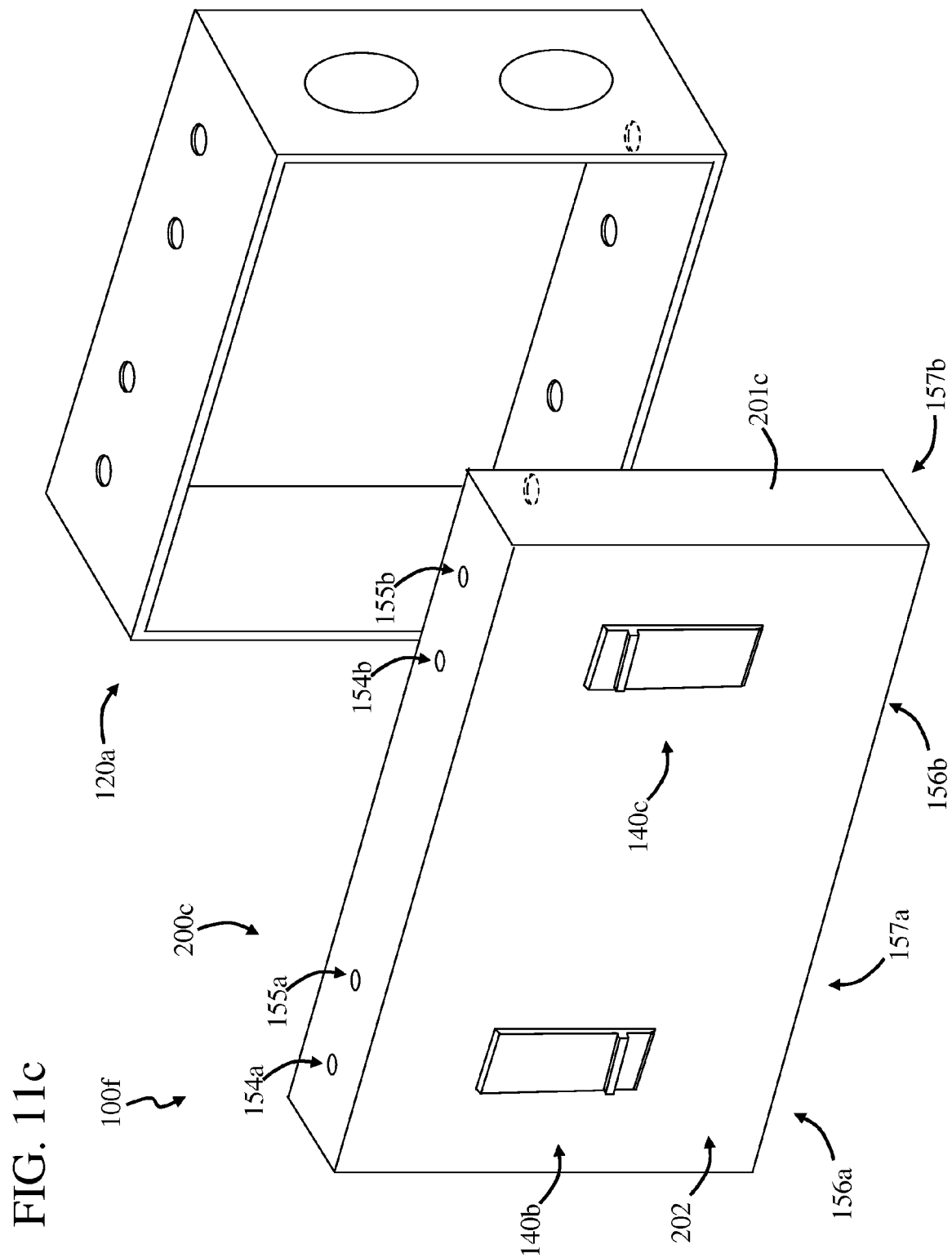
Figure 11D:
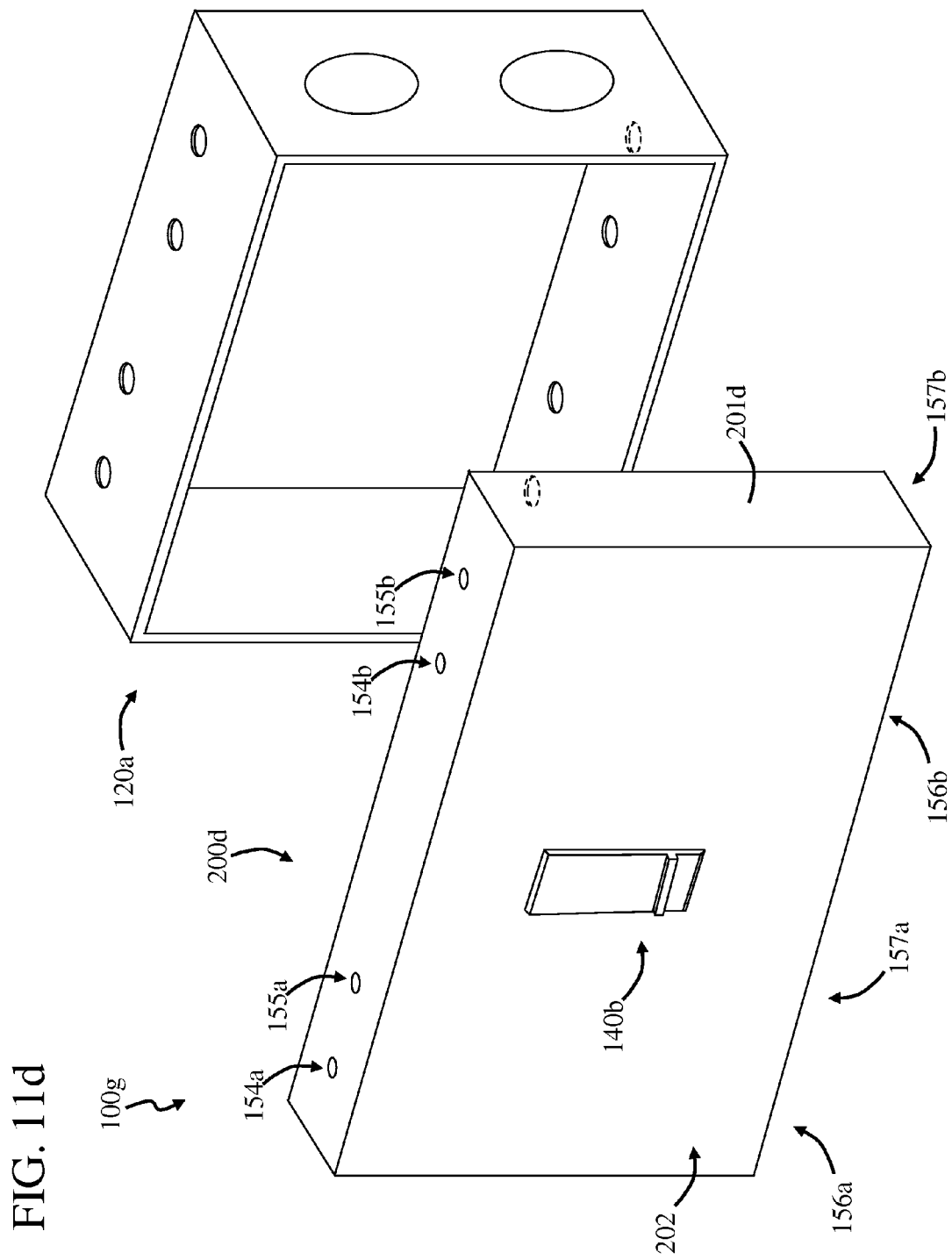

FIGS. 11c and 11d are alternative embodiments of electrical system 100e, which are denoted as electrical systems 100f and 100g, respectively. In the embodiment of FIG. 11c, electrical system 100f includes an elongate power adapter housing 201d having upper power adapter housing openings 154a, 155a, 154b and 155b extending therethrough. Further, elongate power adapter housing 201d has lower power adapter housing openings 156a, 157a, 156b and 157b extending therethrough. In the embodiment of FIG. 11c, electrical system 100f includes dimmer switch assembly 140b operatively coupled to power adapter circuit 202.

Figure 12:
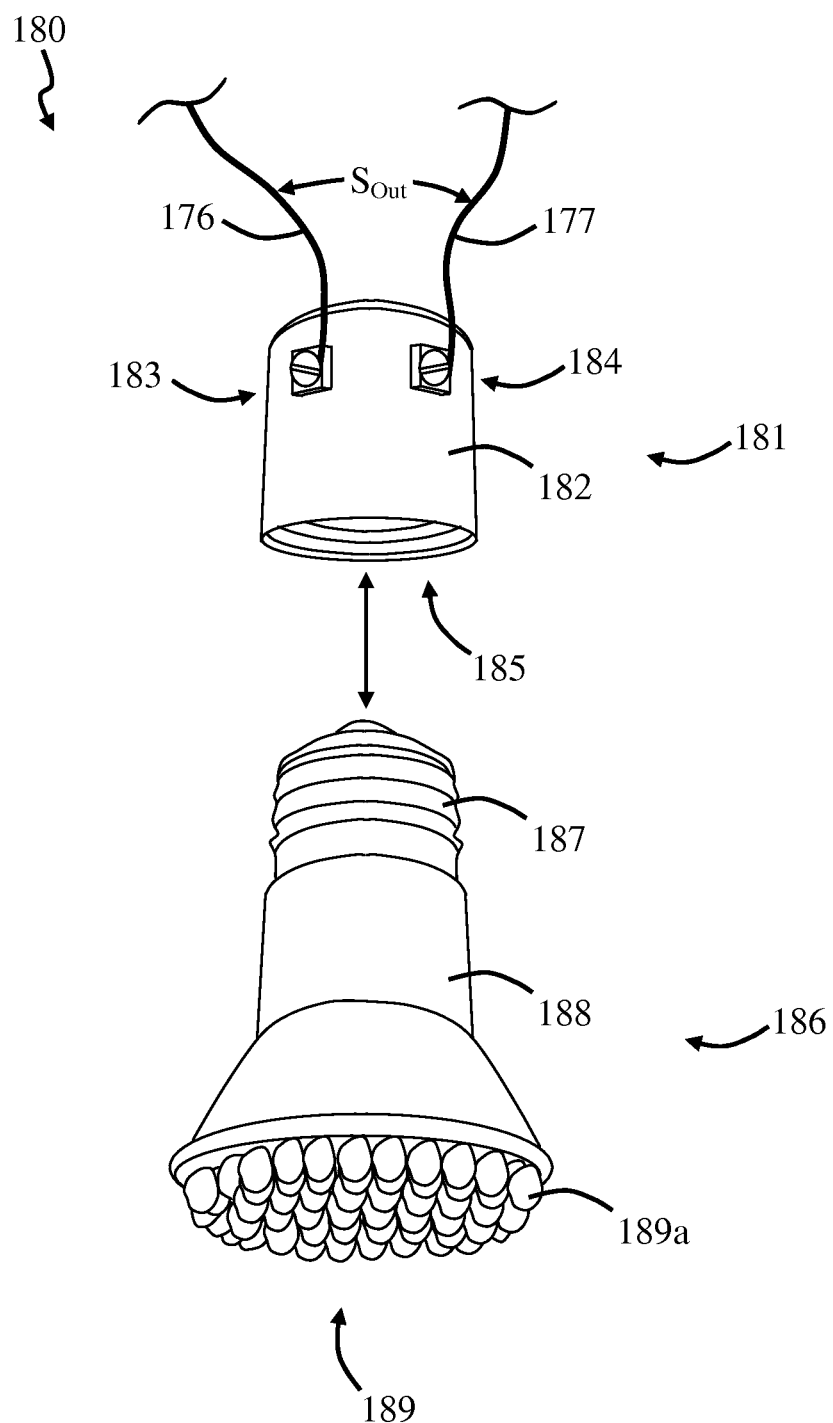
FIG. 12 is a perspective view of one embodiment of an electrical device embodied as a solid-state light emitting device.

FIG. 12 is a perspective view of one embodiment of electrical device 105 embodied as a solid-state light emitting device 180. In this embodiment, solid-state light emitting device 180 includes a light socket 181, which includes a light socket body 182. Light socket 181 carries light socket terminals 183 and 184, wherein light socket terminals 183 and 184 are connected to lines 176 and 177. Light socket terminals 183 and 184 are connected to lines 176 and 177 so that output signal $S_{Out}$ is provided to solid-state light emitting device 180. Light socket body 182 includes a receptacle 185 for receiving a lamp, such as a solid-state lamp, which will be discussed in more detail presently.

In this embodiment, solid-state light emitting device 180 includes a solid-state lamp 186, which includes a solid-state lamp body 188. Solid-state lamp 186 includes a light socket connector 187 sized and shaped to be received by receptacle 185. Solid-state lamp 186 includes a LED array 189 which includes a plurality of LED's 189a. It should be noted that, in general, solid-state lamp 186 includes one or more LED's. LED array 189 can emit many different colors of light, such as white light.

Referring to FIG. 12 and graph 193 of FIG. 2d, solid-state light emitting device 180 is inoperative and does not emit light between times $t_1$ and $t_2$ in response to control assembly 110 being deactivated. Solid-state light emitting device 180 is operative and does emit light between times $t_2$ and $t_3$ in response to control assembly 110 being activated. Further, solid-state light emitting device 180 is inoperative and does not emit light between times $t_3$ and $t_4$ and between times $t_4$ and $t_5$ in response to control assembly 110 being deactivated. Solid-state light emitting device 180 is operative and does emit light for times greater than time $t_6$ in response to control assembly 110 being activated. In this way, solid-state light emitting device 180 is repeatably moveable between operative and inoperative conditions in response to moving control assembly 110 between activated and deactivated conditions.

Figure 13A:
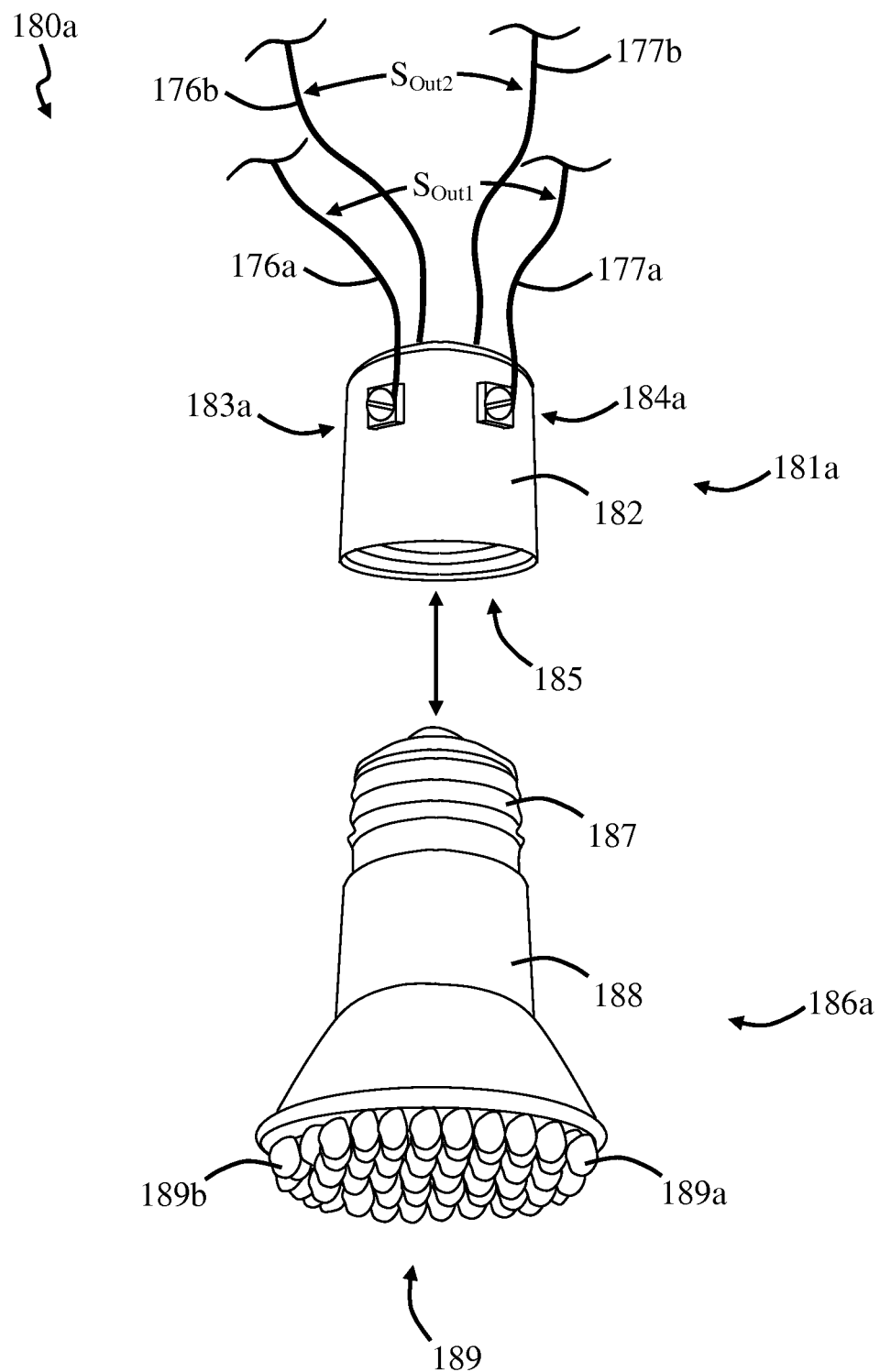
FIG. 13a is a perspective view of another embodiment of an electrical device embodied as a solid-state light emitting device.
Figure 13B:
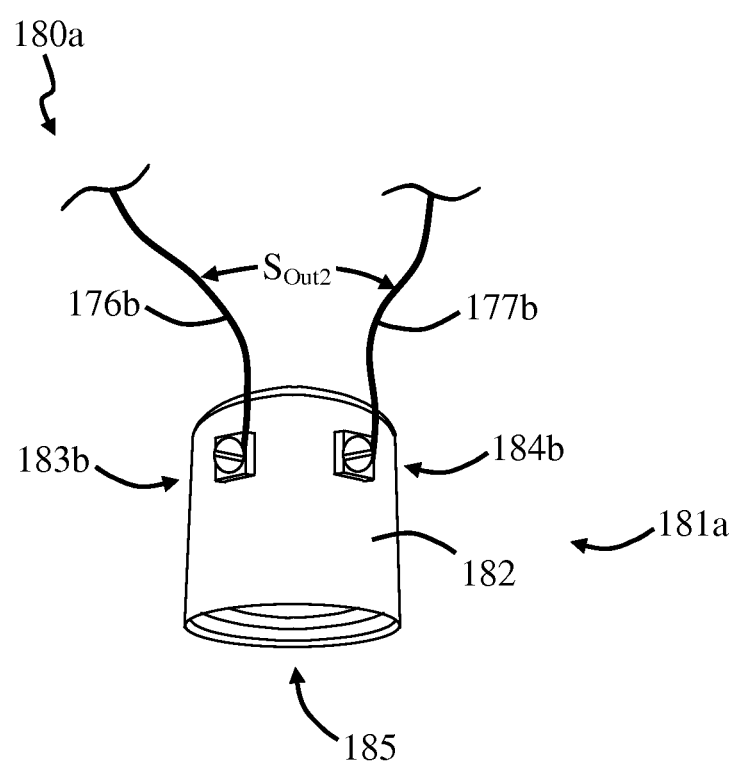

FIG. 13a is a perspective view of one embodiment of electrical device 105 embodied as a solid-state light emitting device 180a. In this embodiment, solid-state light emitting device 180a includes a light socket 181a, which includes light socket body 182. Light socket body 182 includes receptacle 185 for receiving a lamp, such as a solid-state lamp. Light socket 181a carries light socket terminals 183a and 184a, wherein light socket terminals 183a and 184a are connected to lines 176a and 177a. Light socket terminals 183a and 184a are connected to lines 176a and 177a so that output signal $S_{Out}$ is provided to solid-state light emitting device 180. Light socket 181a carries light socket terminals 183b and 184b, as shown in FIG. 13b, wherein light socket terminals 183b and 184b are connected to lines 176b and 177b. Light socket terminals 183b and 184b are connected to lines 176b and 177b so that output signal $S_{Out}$ is provided to solid-state light emitting device 180.

Figure 14:
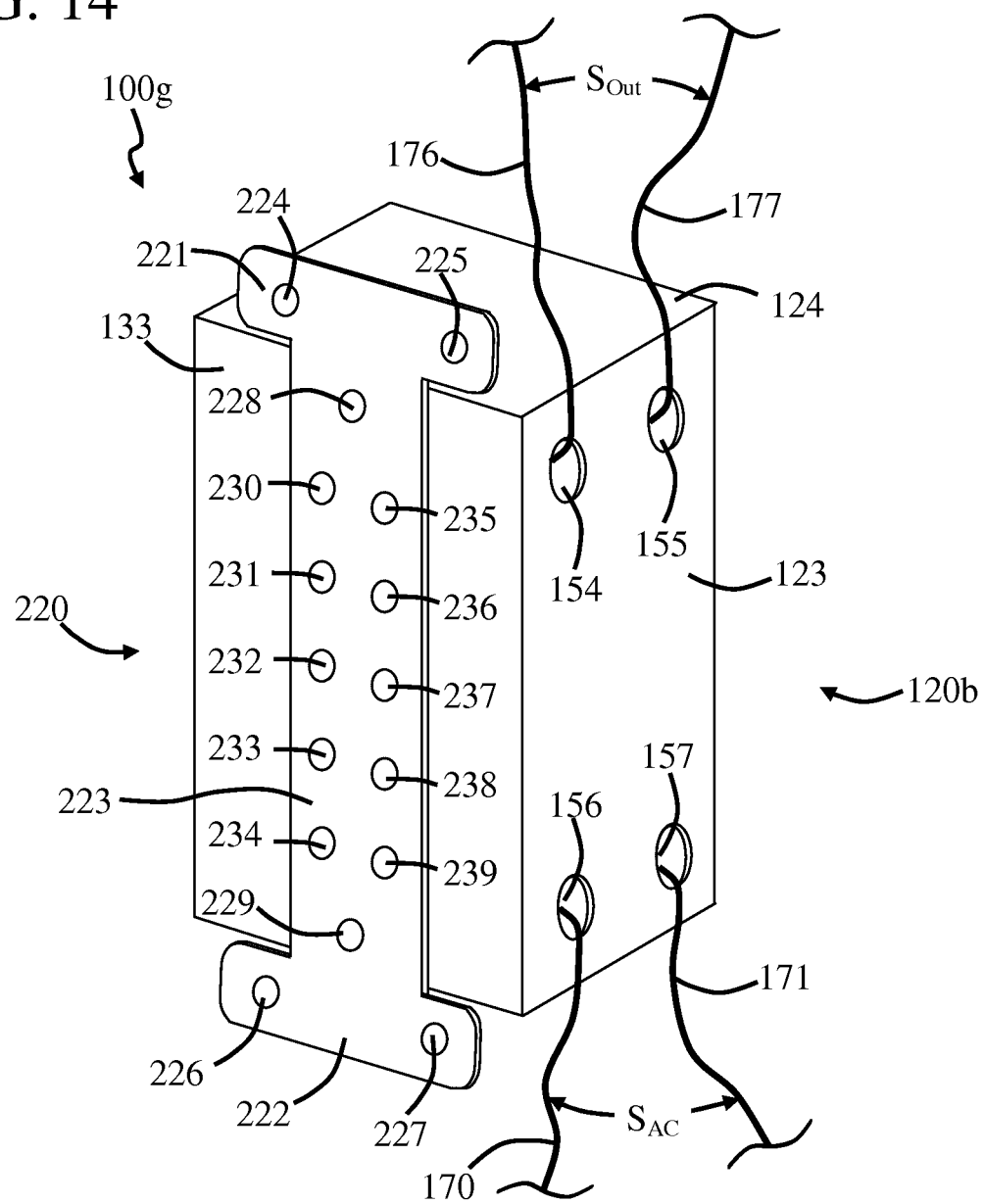
FIG. 14 is a perspective view of an electrical system which includes an electrical connector.

In this embodiment, solid-state light emitting device 180 includes a solid-state lamp 186a, which includes solid-state lamp body 188. Solid-state lamp 186 includes light socket connector 187 sized and shaped to be received by receptacle 185. Solid-state lamp 186 includes LED array 189 which includes a plurality of LED's. In this embodiment, LED array 189 includes LEDs 189a and 189b which emit different wavelengths of light. In operation, LEDs 189a operate in response to output signal $S_{Out1}$ and LEDs 189b operate in response to output signal $S_{Out2}$. Output signals $S_{Out1}$ and $S_{Out2}$ can be provided to solid-state light emitting device 180a in many different ways. In one embodiment, output signals $S_{Out1}$ and $S_{Out2}$ are provided to solid-state light emitting device 180a by operatively coupling solid-state light emitting device 180a to electrical system 100e. In another embodiment, output signals $S_{Out1}$ and $S_{Out2}$ are provided to solid-state light emitting device 180a by operatively coupling solid-state light emitting device 180a to electrical system FIG. 14 is a perspective view of an electrical system 100g. In this embodiment, electrical system 100g includes light switch housing 120 with upper power adapter housing openings 154 and 155 and lower power adapter housing openings 156 and 157 extending through light switch housing sidewall 123. In this embodiment, conductive lines 170 and 171 extend through lower power adapter housing openings 156 and 157, respectively. Further, conductive lines 176 and 177 extend through upper power adapter housing openings 154 and 155, respectively. Conductive lines 170, 171, 176 and 177 are connected to control assembly 110, which is housed by light switch housing 120.

In this embodiment, electrical system 100g includes an electrical connector 220, which is carried by light switch housing 120. Electrical connector 220 is capable of connecting to a removeable switch assembly, as will be discussed in more detail below. Electrical connector 220 includes a faceplate portion 223 having a plurality of electrical connection openings 230, 231, 232, 233, 234, 235, 236, 237, 238 and 239 extending therethrough. Electrical connection openings 230, 231, 232, 233, 234, 235, 236, 237, 238 and 239 are connected to control assembly 110 through corresponding conductive lines (not shown). In this way, electrical connector 220 is connected to control assembly 110. It should be noted that one or more of electrical connection openings 230, 231, 232, 233, 234, 235, 236, 237, 238 and 239 are in communication with conductive lines 170, 171, 176 and/or 177 through control assembly 110.

Electrical connector 220 includes a plurality of mounting openings, which are denoted as mounting openings 224, 225, 226, 227, 228 and 229. Mounting openings 224 and 225 extend through an upper flange portion 221 of faceplate portion 223, and mounting openings 226 and 227 extend through a lower flange portion 222 of faceplate portion 223.

Figure 15B:
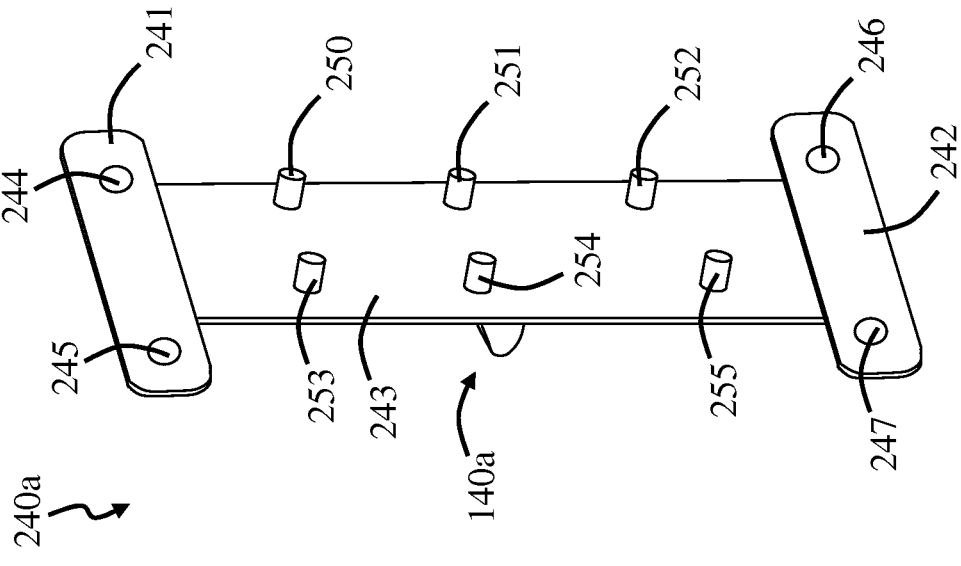
FIGS. 15a and 15b are front and back perspective views, respectively, of one embodiment of a removeable light switch assembly which is capable of being connected to the electrical connector of FIG. 14.
Figure 15A:
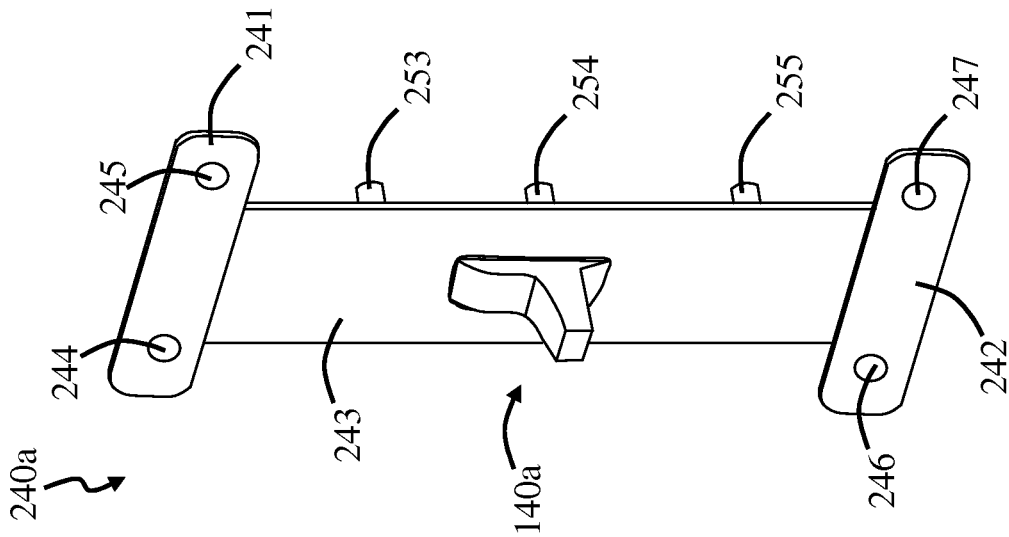
Figure 15C:
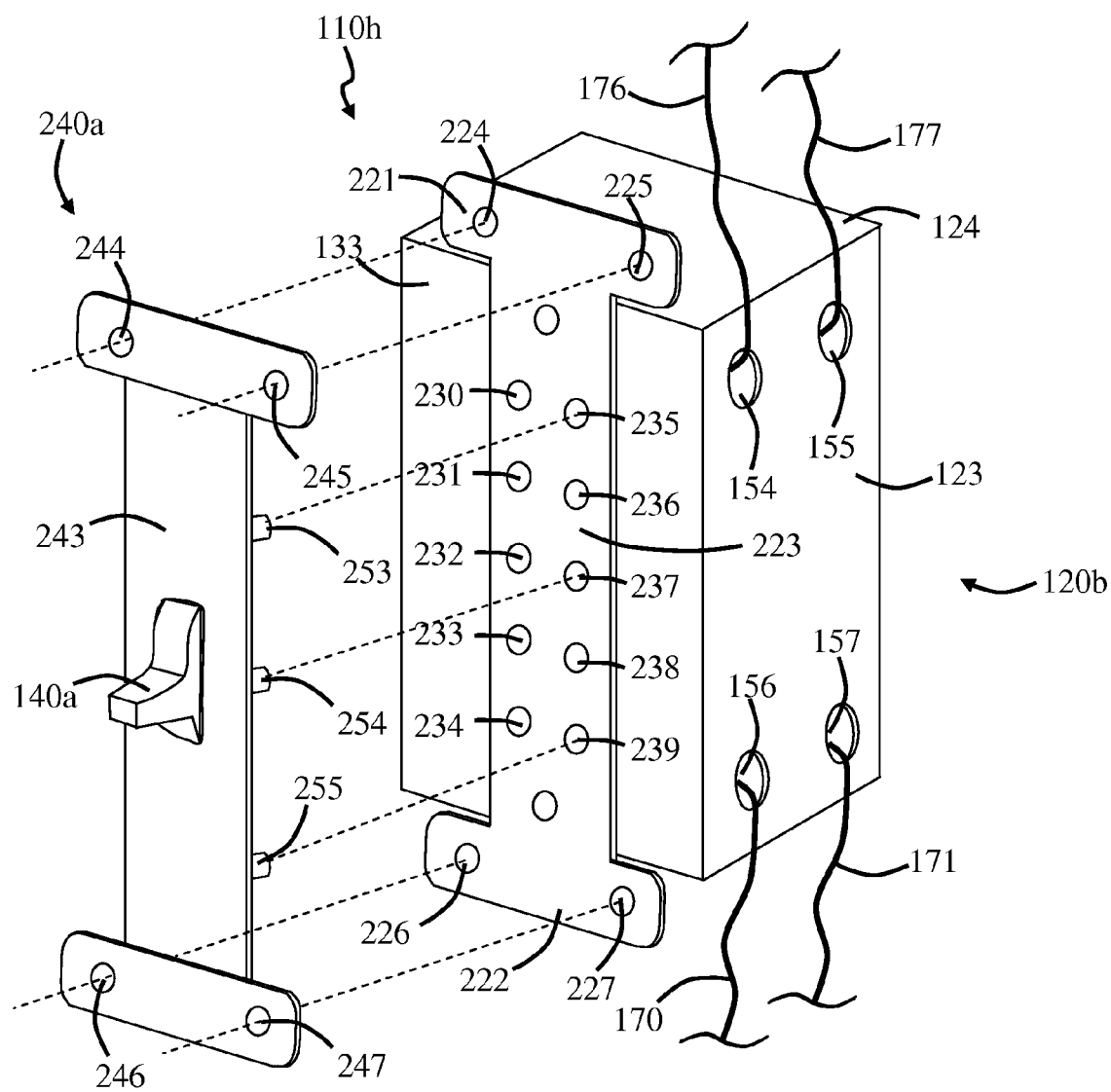
FIGS. 15c and 15d are perspective views of the removeable light switch assembly in connected and disconnected positions with the electrical connector of FIG. 14.
Figure 15D:
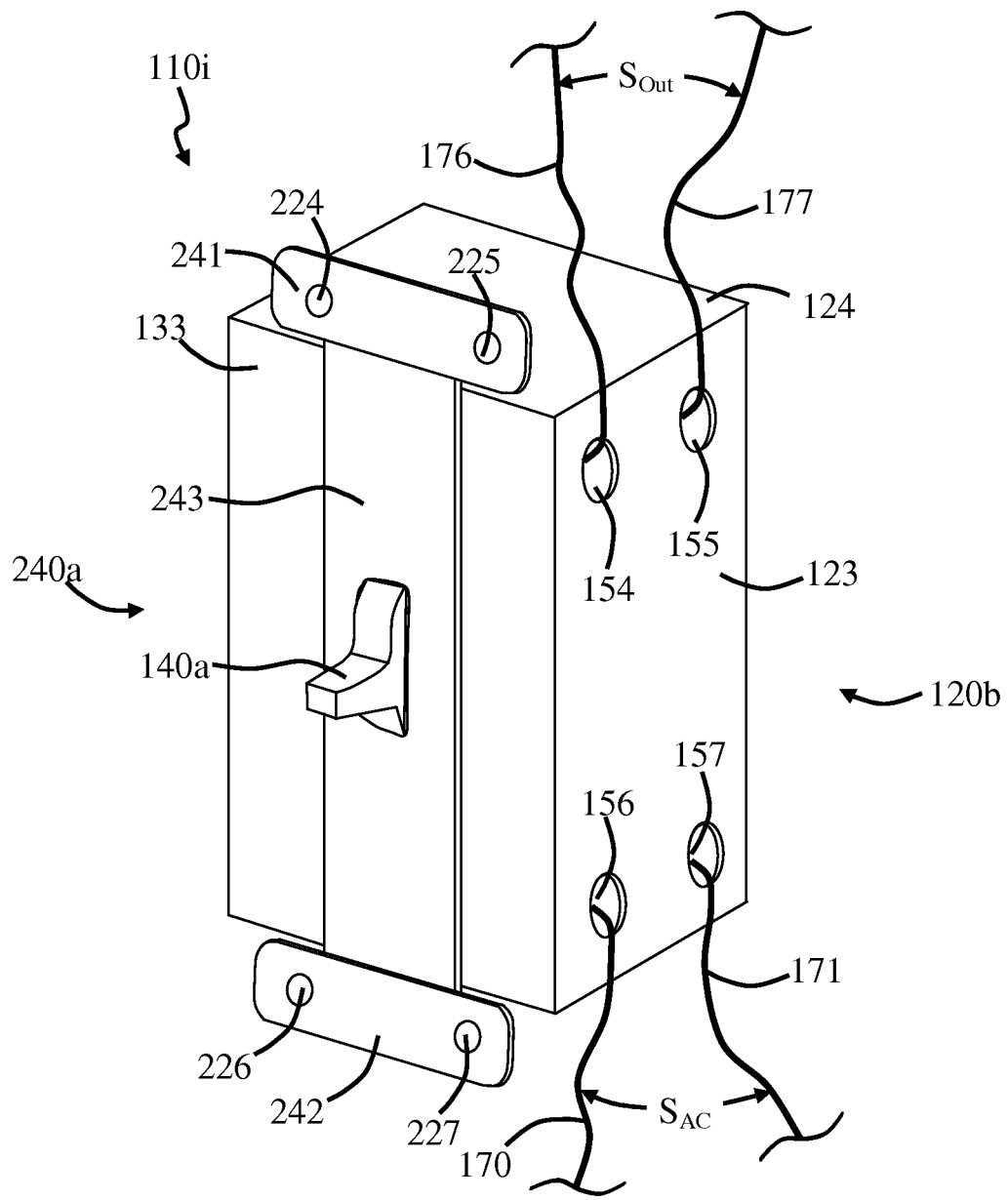

FIGS. 15a and 15b are front and back perspective views, respectively, of one embodiment of a removeable light switch assembly 240a. In this embodiment, removeable light switch assembly 240a includes a faceplate 143 which carries light switch assembly 140a, wherein light switch assembly 140a is operatively connected to a desired combination of terminals 250, 251, 252, 253, 254 and 255. Removeable light switch assembly 240a includes mounting openings 244, 245, 246 and 247. Mounting openings 244 and 245 extend through an upper flange portion 241 of faceplate portion 243, and mounting openings 246 and 247 extend through a lower flange portion 242 of faceplate portion 243. Mounting openings 244 and 245 are aligned with mounting openings 224 and 225 when removeable light switch assembly 240a is operatively connected to electrical connector 220, as indicated in an electrical system 100i of FIG. 15c and as shown in FIG. 15d. Further, mounting openings 246 and 247 are aligned with mounting openings 226 and 227 when removeable light switch assembly 240a is operatively connected to electrical connector 220. It should be noted that removeable light switch assembly 240a is repeatably moveable between a position connected to electrical connector 220, as shown in FIG. 15d, and a position disconnected from electrical connector 220, as shown in FIG. 15d. In operation, output signal $S_{Out}$ is provided in response to light switch assembly 140a being activated. Further, output signal $S_{Out}$ is not provided in response to light switch assembly 140a being deactivated. In operation, output signal $S_{Out}$ is provided in response to removeable light switch assembly 240a being adjusted.

Figure 16A:
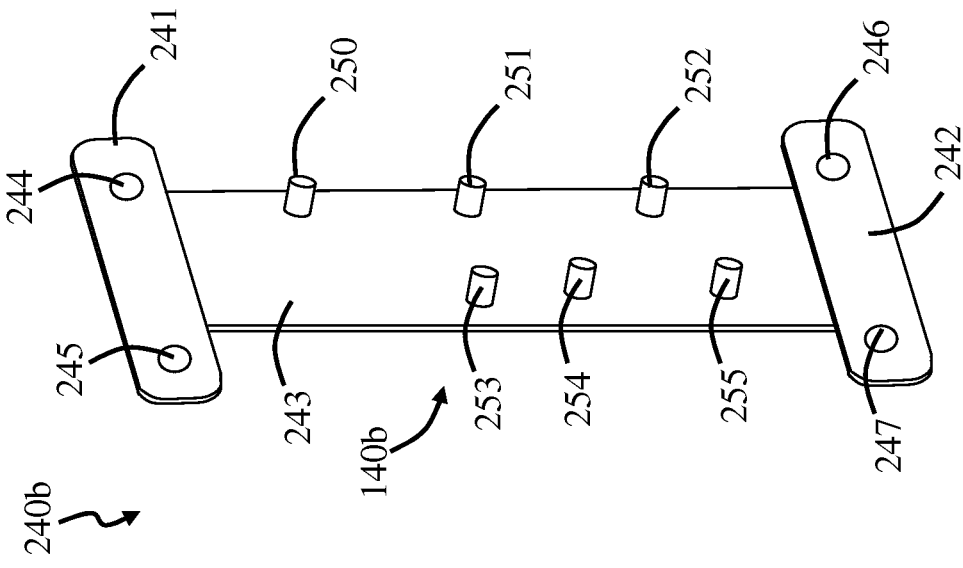
FIGS. 16a and 16b are front and back perspective views, respectively, of one embodiment of a removeable dimmer switch assembly which is capable of being connected to the electrical connector of FIG. 14.
Figure 16B:
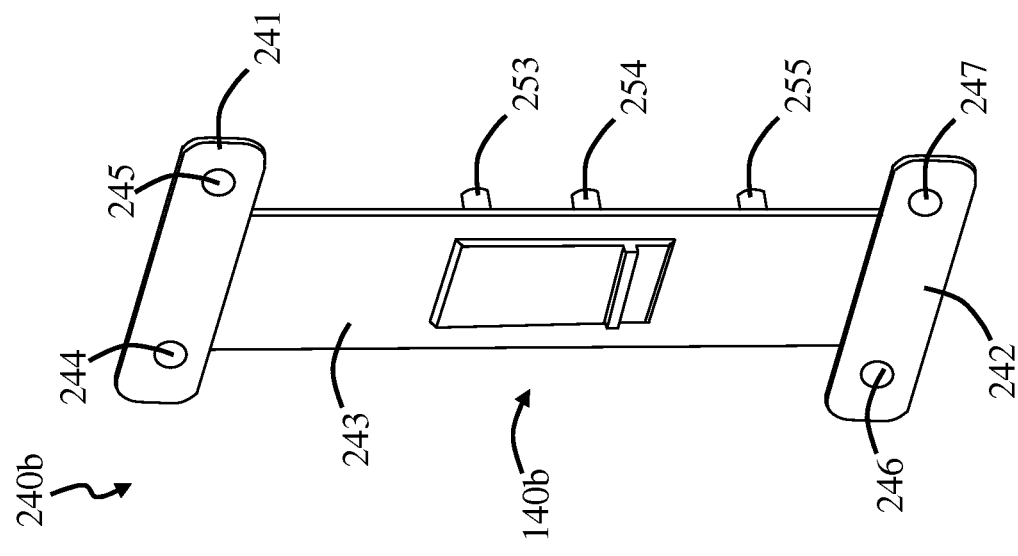
Figure 16C:
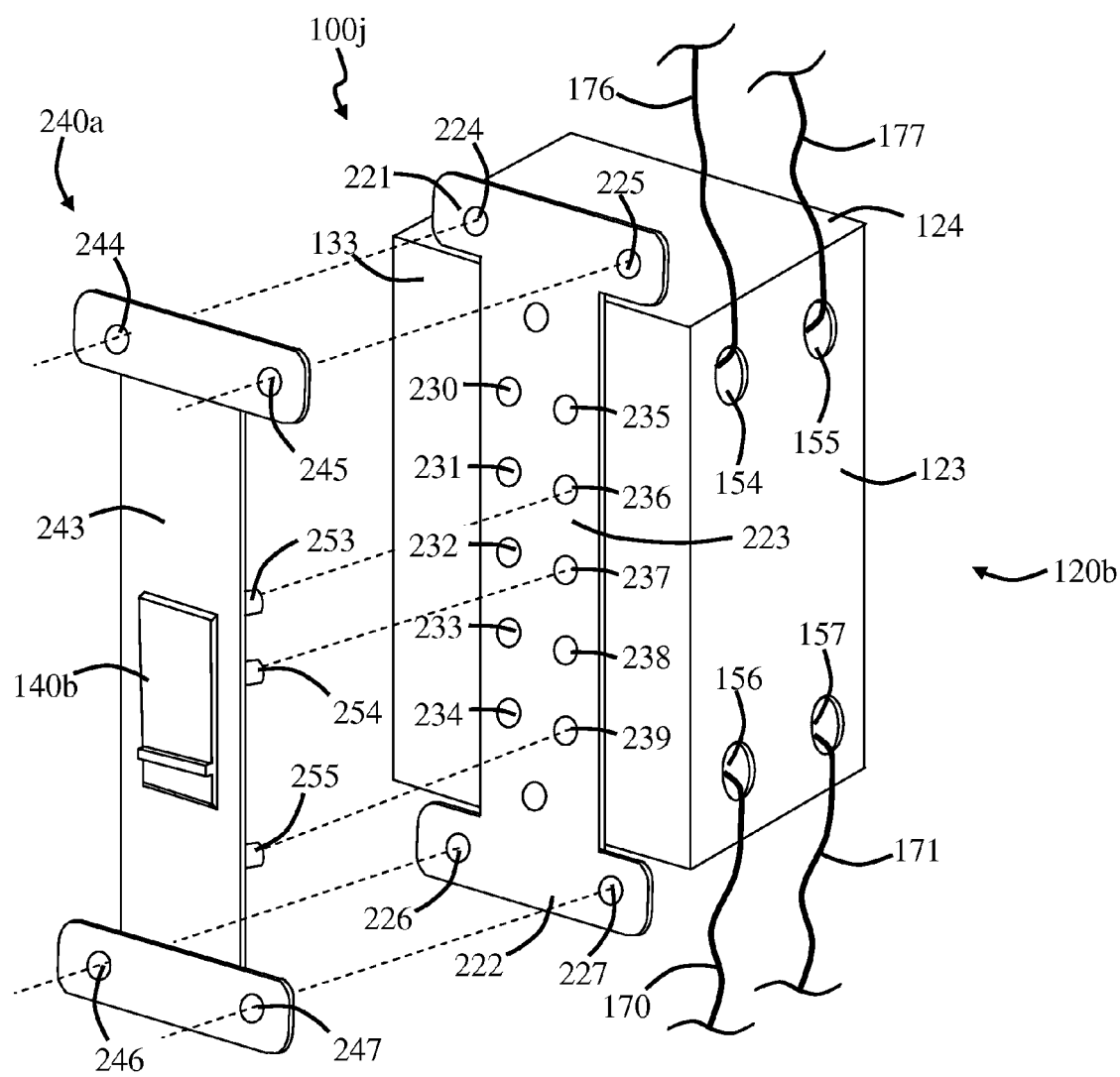
FIGS. 16c and 16d are perspective views of the removeable dimmer switch assembly in connected and disconnected positions with the electrical connector of FIG. 14.
Figure 16D:
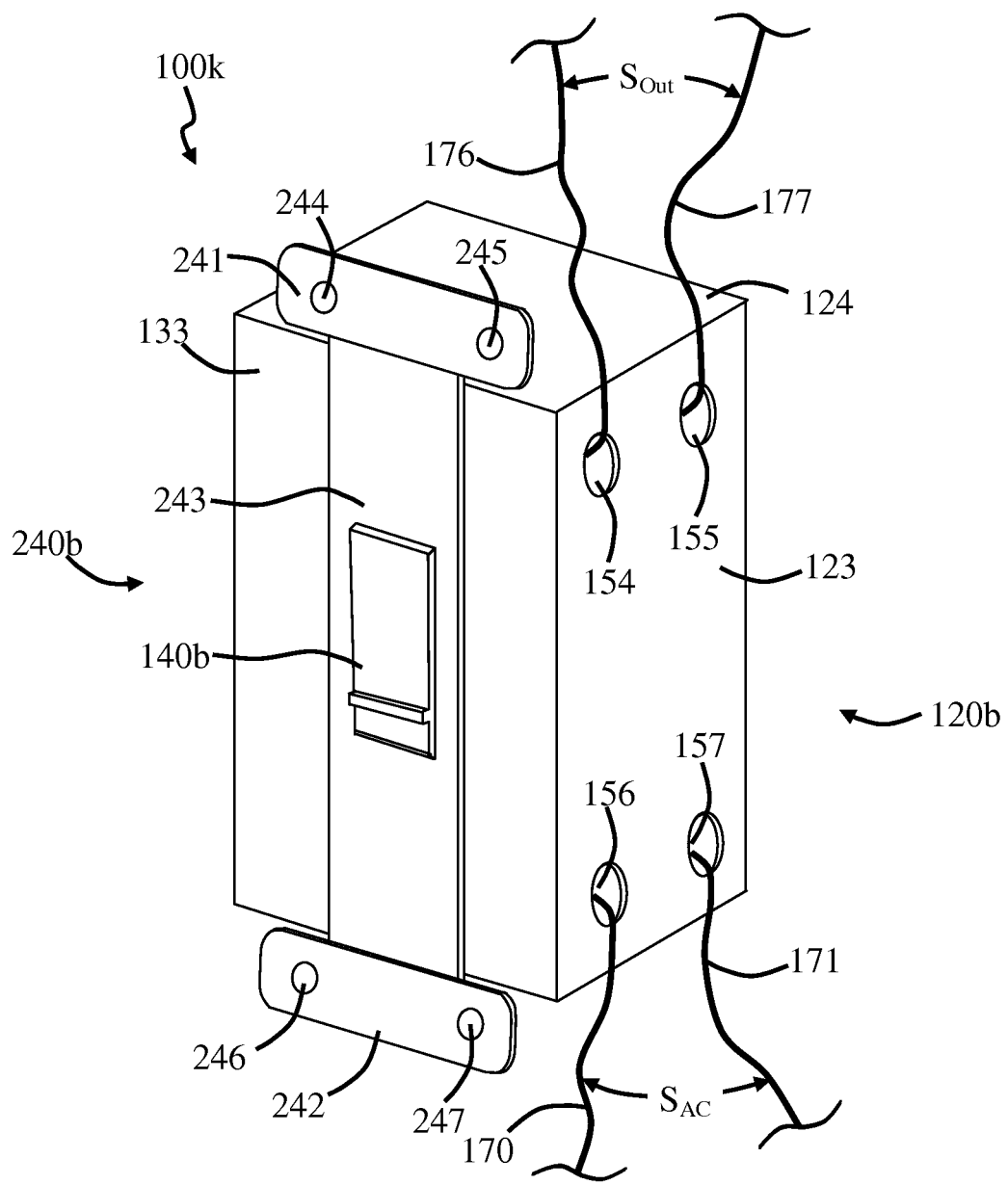

FIGS. 16a and 16b are front and back perspective views, respectively, of one embodiment of a removeable dimmer switch assembly 240b. In this embodiment, removeable dimmer switch assembly 240b includes faceplate 143 which carries removeable dimmer switch assembly 240b, wherein removeable dimmer switch assembly 240b is operatively connected to a desired combination of terminals 250, 251, 252, 253, 254 and 255. Removeable dimmer switch assembly 240b includes mounting openings 244, 245, 246 and 247. Mounting openings 244 and 245 extend through upper flange portion 241 of faceplate portion 243, and mounting openings 246 and 247 extend through lower flange portion 242 of faceplate portion 243. Mounting openings 244 and 245 are aligned with mounting openings 224 and 225 when removeable dimmer switch assembly 240b is operatively connected to electrical connector 220, as indicated in an electrical system 100j of FIG. 16c and as shown in FIG. 16d. Further, mounting openings 246 and 247 are aligned with mounting openings 226 and 227 when removeable dimmer switch assembly 240b is operatively connected to electrical connector 220. It should be noted that removeable dimmer switch assembly 240b is repeatably moveable between a position connected to electrical connector 220, as shown in FIG. 16d, and a position disconnected from electrical connector 220, as shown in FIG. 16d. In operation, output signal $S_{Out}$ is provided in response to removeable dimmer switch assembly 240b being adjusted.

Figure 16E:
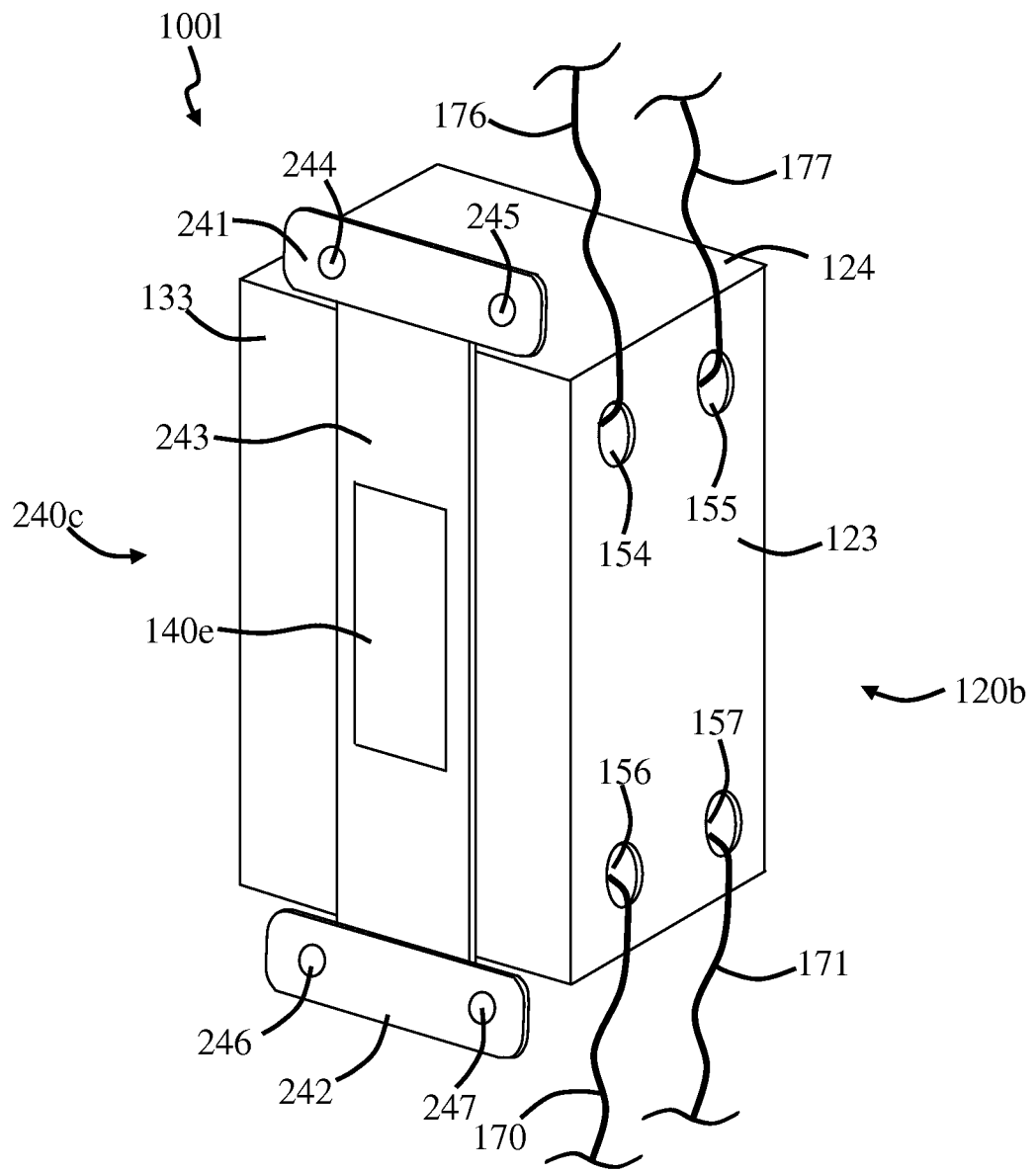
FIG. 16e is a perspective view of an electrical system, which includes a touch pad assembly connected to the electrical connector of FIG. 14.

FIG. 16e is a perspective view of an electrical system 1001, which includes light switch housing 120b, as described in more detail with FIG. 14. In this embodiment, electrical system 1001 includes a removeable touch pad assembly 240c which is operatively connected to electrical connector 220. Removeable touch pad assembly 240c is repeatably moveable between a position connected to electrical connector 220 and a position disconnected from electrical connector 220. In operation, output signal $S_{Out}$ is provided in response to touch switch assembly 240c being engaged, such as with a finger. Further, output signal $S_{Out}$ is not provided when touch switch assembly 240c is not engaged.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

The invention claimed is:

1. An electrical system, comprising
an electrical device which operates in response to receiving a DC signal;
a light switch assembly which includes a light switch operatively coupled to an AC-to-DC converter, wherein the light switch assembly provides the DC signal to the electrical device in response to the light switch being activated and wherein the light switch assembly drives the DC signal to a level below a threshold level in response to the light switch being deactivated; and further including
an electrical controller which provides a control signal $S_{Control}$ modulated with the DC signal to the electrical device.

2. The system of claim 1, wherein the light switch does not provide the DC signal to the electrical device in response to the light switch being deactivated.

3. The system of claim 1, wherein the light switch assembly includes a light switch housing which carries the AC-to-DC converter and light switch.

4. The system of claim 1, wherein the light switch assembly operates as a dimmer switch.

5. The system of claim 1, wherein the electrical device is a solid-state light emitting device.

6. The system of claim 5 wherein the solid-state light emitting device is a two-wire lamp.

7. The system of claim 1 wherein the solid-state light emitting device is a two-wire lamp.

8. An electrical system, comprising an electrical device which operates in response to receiving a DC signal;
a light switch assembly which includes a light switch operatively coupled to an AC-to-DC converter, wherein the light switch assembly provides the DC signal to the electrical device in response to the light switch being activated; and further including
an electrical controller which provides a control signal $S_{Control}$ modulated with the DC signal to the electrical device, and wherein the controller comprises a pulse wave modulator.

9. The lighting system of claim 8 wherein the controller is positioned near the light switch.

10. The lighting system of claim 9 wherein the controller is positioned upon an outside wall of the light switch housing.

11. The lighting system of claim 9 wherein the controller is positioned within the light switch housing.

12. A lighting system comprising
a. an AC to DC converter having an AC side and a DC side and supplying a DC voltage,
b. a light switch in a wall-mounted light switch housing,
c. an electrical controller comprising a pulse wave modulator, and
d. an LED lamp, and wherein
i. the light switch is in electrical communication with the DC side of the converter,
ii. the light switch is in electrical communication with an input side of the pulse wave modulator of the electrical controller,
iii. the pulse wave modulator is configured to provide a first pulsed DC signal modulated with a DC signal generated from the DC voltage for a first position of the light switch, and
iv. the LED lamp is configured to receive the first pulsed DC signal generated by the pulse wave modulator to output a first intensity of light.

13. The lighting system of claim 12 wherein the pulse wave modulator is configured to provide a second pulsed DC signal for a second position of the light switch, wherein the second pulsed DC signal differs from the first pulsed DC signal.

14. The lighting system of claim 13 wherein the second pulsed DC signal provides a second duration of pulse different from a first duration of pulse for the first pulsed DC signal and wherein the first and second pulsed DC signals have a voltage greater than a threshold voltage level.

15. The lighting system of claim 13 wherein the first pulsed DC signal has a first nominal output voltage $S_{out}$ and the second pulsed DC signal has a second nominal output voltage $S_{out}$ that differs from the first nominal output voltage and wherein the first and second pulsed DC signals have a voltage greater than a threshold voltage level.

16. The lighting system of claim 15 wherein the LED lamp is a two-wire lamp.

17. The lighting system of claim 13 wherein the second pulsed DC signal has a nominal value of voltage other than zero and the LED lamp is off.

18. The lighting system of claim 12 wherein the LED lamp is a two-wire lamp.

19. The lighting system of claim 12 wherein the pulse wave modulator is located remote from the LED lamp.

20. The lighting system of claim 19 wherein the pulse wave modulator is positioned near the light switch.

21. The lighting system of claim 20 wherein the pulse wave modulator is positioned upon an outside wall of the light switch housing.

22. The lighting system of claim 20 wherein the pulse wave modulator is positioned within the light switch housing.

23. The lighting system of claim 12 wherein the first pulsed DC signal is beneath a threshold value so that the LED lamp is off.

24. The lighting system of claim 12 wherein the LED lamp has a plurality of LEDs that emit light in response to a plurality of pulsed DC signals, said plurality including the first pulsed DC signal.

25. The lighting system of claim 12 wherein the pulse wave modulator is configured to pulse to encode data in the first pulsed DC signal.

* * * * *